(12) United States Patent
Tsunoda

(10) Patent No.: US 10,432,203 B2
(45) Date of Patent: Oct. 1, 2019

(54) SIGNAL RECOVERY CIRCUIT, OPTICAL MODULE, AND SIGNAL RECOVERY METHOD

(71) Applicant: FUJITSU LIMITED, Kawasaki-shi, Kanagawa (JP)

(72) Inventor: Yukito Tsunoda, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/178,639

(22) Filed: Nov. 2, 2018

(65) Prior Publication Data

US 2019/0165793 A1    May 30, 2019

(30) Foreign Application Priority Data

Nov. 24, 2017    (JP) ................................. 2017-226249

(51) Int. Cl.
*H03L 7/08* (2006.01)
*H03L 7/085* (2006.01)
*H04B 10/54* (2013.01)
*H03L 7/099* (2006.01)

(52) U.S. Cl.
CPC ............ *H03L 7/0807* (2013.01); *H03L 7/085* (2013.01); *H03L 7/099* (2013.01); *H04B 10/541* (2013.01)

(58) Field of Classification Search
CPC ....... H03L 7/0807; H03L 7/099; H03L 7/085; H04B 10/541
See application file for complete search history.

(56) References Cited

U.S. PATENT DOCUMENTS

| 4,005,477 A * | 1/1977 | Ottesen ............ G11B 20/10009 |
| | | 360/28 |
| 6,259,755 B1 | 7/2001 | O'Sullivan et al. |
| 6,680,634 B1 * | 1/2004 | Ruha ..................... H03L 7/0812 |
| | | 327/149 |
| 2009/0190709 A1 * | 7/2009 | Marie .................. H03C 3/0925 |
| | | 375/376 |
| 2017/0104492 A1 | 4/2017 | Ide |

FOREIGN PATENT DOCUMENTS

| JP | 05-68132 U | 9/1993 |
| JP | 10-285150 | 10/1998 |
| JP | 2013-017076 | 1/2013 |
| JP | 2017-073700 | 4/2017 |

\* cited by examiner

*Primary Examiner* — Jean B Corrielus
(74) *Attorney, Agent, or Firm* — Fujitsu Patent Center

(57) ABSTRACT

A signal recovery circuit includes, a voltage controlled oscillator that generate a clock signal, a phase frequency comparison circuit that compares phases of the clock signal and an received input signal and compares frequencies of the clock signal and the received input signal, a voltage adjustment circuit that adjusts the phase of the clock signal by adjusting control voltage of the voltage controlled oscillator based on an output of the phase frequency comparison circuit, and a control circuit that acquires an amplitude of the received input signal, detects continuation of the same sign in the received input signal based on the acquired amplitude, stops an adjustment of the phase of the clock signal generated by the voltage controlled oscillator when the continuation of the same sign is detected, and executes adjustment of the phase of the clock signal when the continuation of the same sign is stopped.

12 Claims, 16 Drawing Sheets

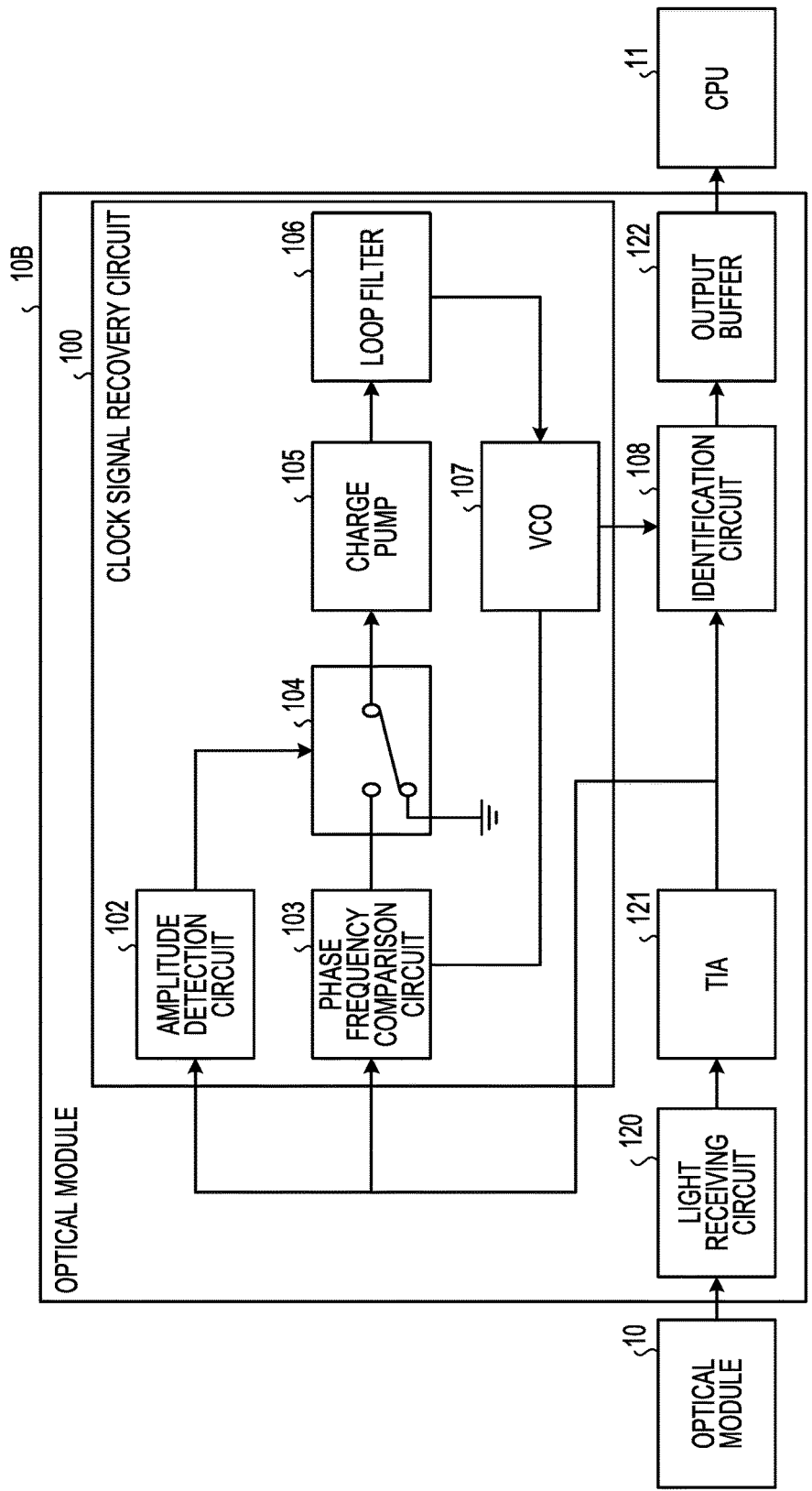

SIGNAL RECOVERY CIRCUIT, OPTICAL MODULE, AND SIGNAL RECOVERY METHOD

CROSS-REFERENCE TO RELATED APPLICATION

This application is based upon and claims the benefit of priority of the prior Japanese Patent Application No. 2017-226249, filed on Nov. 24, 2017, the entire contents of which are incorporated herein by reference.

FIELD

The embodiments discussed herein are related to a signal recovery circuit, an optical module, and a signal recovery method.

BACKGROUND

In recent years, with the increase in transmission capacity, an optical communication using, for example, optical fibers has been developed dramatically in the field of communication. In the optical communication, an information processing apparatus such as an optical module that converts an electric signal into an optical signal is used, and data transmission and reception by optical signals are performed between information processing apparatuses of a transmitting side and a receiving side via a transmission path such as an optical fiber.

In order to reliably transmit and receive a digital signal in the optical communication, the information processing apparatus of the receiving side is required to determine each data bit at a correct timing. The information processing apparatus of the receiving side determines data by using timing information for determining the timing of reading the data. As a means for acquiring the timing information, there is a method in which the information processing apparatus of the transmitting side transmits a clock signal in parallel to a data signal. In such a method, the information processing apparatus of the receiving side reads the data, for example, at a vertical rising timing of the received clock signal.

In this regard, considering that it is difficult to adjust the timing of the clock transmitted in parallel to the data due to a transmission delay in a high-speed data communication such as the optical communication, a method has been frequently adopted recently which embeds clock information in the data signal and recovers the clock by the information processing apparatus of the receiving side. The recovery of the clock is performed by a signal recovery (clock data recovery (CDR)) circuit of the information processing apparatus of the receiving side.

As for the signal recovery circuit, a phase locked loop (PLL) circuit is used, which includes, for example, a phase/frequency comparator, a loop filter, and a voltage controlled oscillator (VCO). The signal recovery circuit recovers a clock signal by adjusting the control voltage for the VCO for the clock by comparing with the phase of an internal reference clock signal with a data edge corresponding to the falling or vertical rising of the received data signal by using, for example, the PLL circuit.

Here, as for a recovery technique of the clock signal, there is related art that suppresses the phase shift by masking a phase detection when the same sign is continuously detected. Further, there is related art that widens a synchronization pull-in range of the phase locked loop by using a frequency detector. In addition, there is related art that integrates a predetermined number of clocks and adjusts the control voltage for each cycle of the integrated unit group. Further, there is related art that maintains the output frequency set before the supply of a reference clock signal is interrupted at the time of interrupting the supply of the reference clock signal.

Related techniques are disclosed in, for example, Japanese Laid-open Patent Publication Nos. 2017-073700, 10-285150, and 2013-017076, and Japanese Laid-open Utility Model Publication No. 05-068132.

SUMMARY

According to an aspect of the embodiments, a signal recovery circuit includes, a voltage controlled oscillator that generate a clock signal, a phase frequency comparison circuit that compares phases of the clock signal and an received input signal and compares frequencies of the clock signal and the received input signal, a voltage adjustment circuit that adjusts the phase of the clock signal by adjusting control voltage of the voltage controlled oscillator based on an output of the phase frequency comparison circuit, and a control circuit that acquires an amplitude of the received input signal, detects continuation of the same sign in the received input signal based on the acquired amplitude, stops an adjustment of the phase of the clock signal generated by the voltage controlled oscillator when the continuation of the same sign is detected, and executes adjustment of the phase of the clock signal when the continuation of the same sign is stopped.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 2B is a block diagram of an optical module (receiving side) according to Embodiment 1;

DESCRIPTION OF EMBODIMENTS

In a signal recovery circuit that uses a phase locked loop circuit, a phase comparison is not performed at a time when there is no data edge. Therefore, when the same code is continued as a data signal for an extended time, the control voltage of a VCO for a clock fluctuates, causing a phase shift, or jitter, of the clock signal. As a result, each data may not be determined at a correct timing and, for example, a code error occurs, thereby causing a deterioration of a transmission quality.

In the related art of masking the phase detection when the same sign is continuously detected, the same code is continuously detected using the asymmetry of charging/discharging of a capacitor in which a charge speed of the capacitor is relatively fast and a discharge speed is relatively slow. Therefore, there is a limit to increasing the discharge speed, and as a result, it is difficult to detect the short pulse transitions such as an isolated "1" pattern or an isolated "0" pattern. Therefore, it is difficult to detect a momentary discontinuity of consecutive same signs in the related art, and the phase detection is continued to be masked even when the continuation of the same code is interrupted and there is a possibility that the transmission quality may deteriorate.

In the case of using the related art of adjusting the control voltage for each cycle of a unit group, there is a risk of missing detection of the phase shift, and the transmission quality may deteriorate. Further, in the related art that maintains the output frequency set before the interruption of supply at the time of interrupting the supply of a reference clock signal, continuation of the same signs is not considered and it is difficult to alleviate deterioration of transmission quality caused by the continuation of the same sign.

Hereinafter, embodiments of a signal recovery circuit (e.g., a CDR circuit), an optical module, and a signal recovery method disclosed in the present disclosure will be described in detail with reference to the accompanying drawings. Further, the signal recovery circuit, the optical module, and the signal recovery method disclosed by the present disclosure are not limited by the following embodiments.

Embodiment 1

Figure 1:
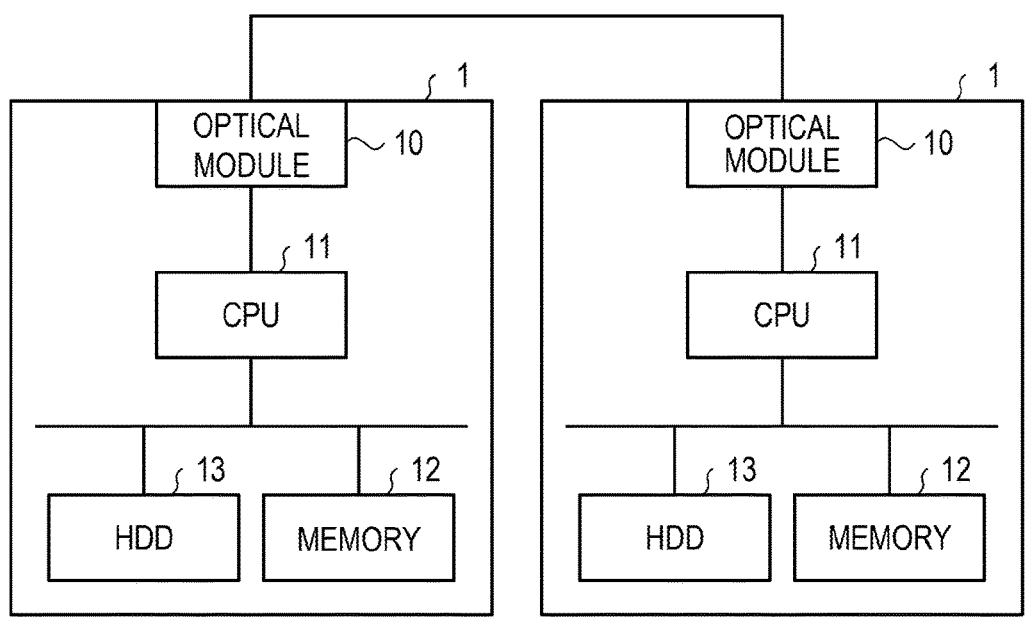
FIG. 1 is a diagram illustrating an example of a system configuration of an information system using an optical module.

FIG. 1 is a diagram illustrating an example of a system configuration of an information system using an optical module. As illustrated in FIG. 1, the optical module 10 is used for a communication between information processing apparatuses 1 such as servers. In the information processing apparatus 1, the optical modules 10 are connected with each other by using an optical communication cable such as an optical fiber.

A central processing unit (CPU) 11 mounted on the information processing apparatus 1 performs an arithmetic processing while using, for example, a memory 12 and a hard disk drive (HDD) 13. In addition, the CPU 11 communicates with another information processing apparatus 1 through the optical module 10. The optical module 10 performs the communication using, for example, the Ethernet (registered trademark).

Specifically, the CPU 11 transmits a data signal to be transmitted to another information processing apparatus 1, to the optical module 10. In this case, the CPU 11 embeds the clock signal in the data signal. In addition, the optical module 10 converts the data signal received from the CPU 11 from an electric signal to an optical signal. Further, the optical module 10 outputs the data signal changed to the optical signal to the optical module 10 of another information processing apparatus 1.

In addition, when the optical module 10 receives the optical signal from the optical module 10 of another information processing apparatus 1, the optical module 10 converts the received data signal into the electric signal. Further, the optical module 10 according to the embodiment converts the optical signal into the electric signal to recover the clock from the electric data signal. Thereafter, the optical module 10 determines the received data signal by using the recovered clock. In addition, the optical module 10 transmits the determined data signal to the CPU 11.

Here, as the information processing apparatus 1, the server is described as an example, but the information processing apparatus 1 may be any other apparatus as long as it is an apparatus that transmits and receives the data signal, and may be, for example, a storage. In addition, the optical module 10 may receive the data signal from apparatuses other than the CPU 11. Further, the signal recovery circuit is not limited to the optical module and may be a transmission/reception circuit of the electric signal. The optical module 10 included in the information processing apparatus 1 may be either a transmitting side or a receiving side of data.

Figure 2A:
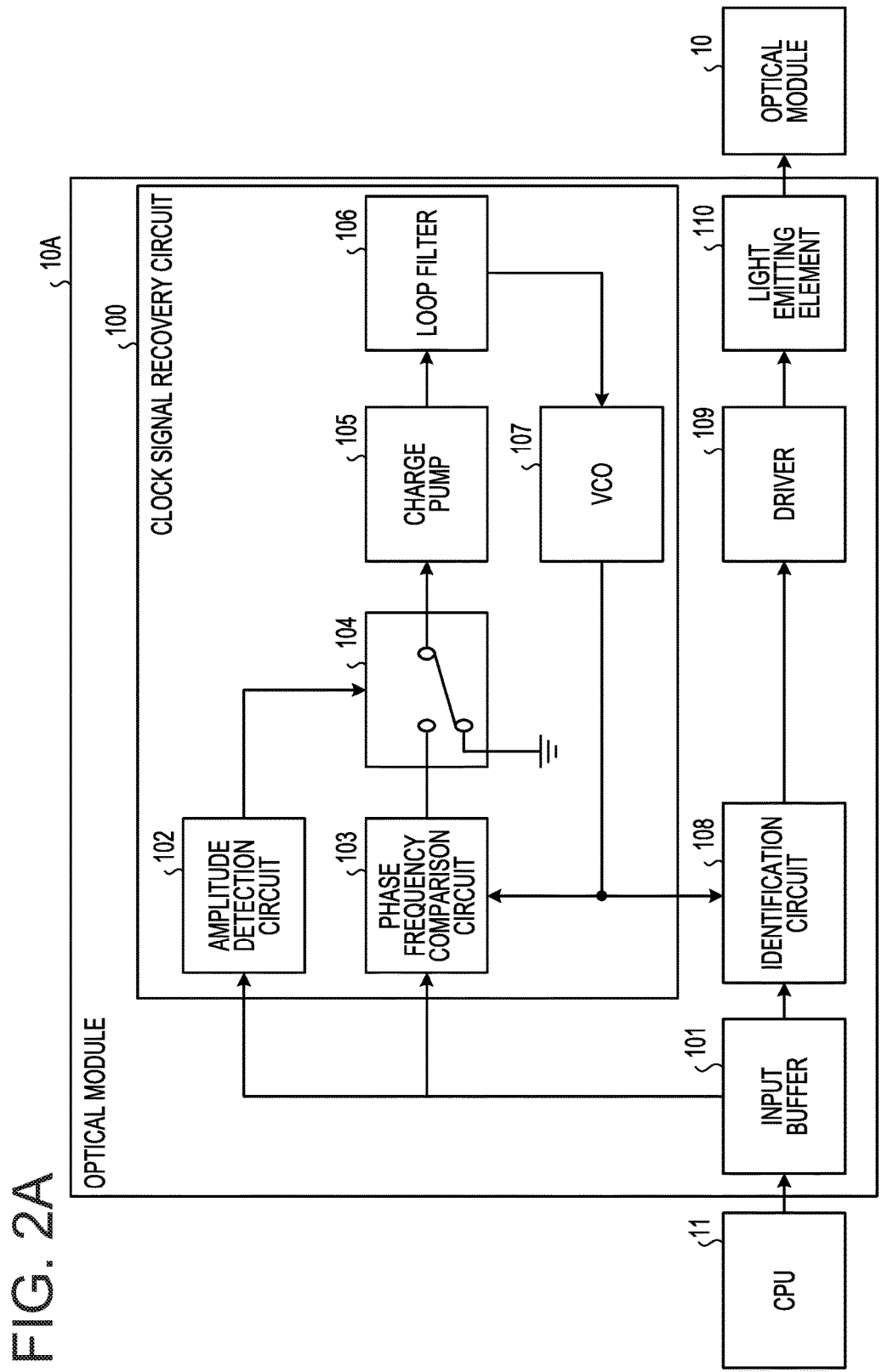
FIG. 2A is a block diagram of an optical module (transmitting side) according to Embodiment 1.

FIG. 2A is a block diagram of an optical module (transmitter) according to Embodiment 1. An optical module 10A includes a signal recovery circuit 100, an input buffer 101, an identification circuit 108, a drive circuit 109, and a light emitting circuit 110.

The input buffer 101 receives an input of the data signal from the CPU 11. In addition, the input buffer 101 shapes the received signal. Thereafter, the input buffer 101 outputs the data signal to an amplitude detection circuit 102, a phase frequency comparison circuit 103, and an identification circuit 108. Here, since the data signal output from the input buffer 101 includes noise or jitter generated by transmission of the signal from the CPU 11 up to the optical module 10, the noise or jitter needs to be suppressed.

The signal recovery circuit 100 is a circuit that recovers the clock signal from the data signal. The signal recovery circuit 100 includes the amplitude detection circuit 102, the phase frequency comparison circuit 103, a switch 104, a charge pump 105, a loop filter 106, and a VCO 107.

The VCO 107 is an oscillator whose oscillation frequency varies depending on the input control voltage. The VCO 107 receives the input of the control voltage from the loop filter 106. In addition, the VCO 107 oscillates depending on the input control voltage to generate the clock signal. The VCO 107 outputs the generated clock signal to the phase frequency comparison circuit 103 and the identification circuit 108. The VCO 107 corresponds to an example of "voltage controlled oscillator."

The phase frequency comparison circuit 103 receives the input of the clock signal from the VCO 107. Further, the phase frequency comparison circuit 103 acquires the data signal output from the input buffer 101. In addition, the phase frequency comparison circuit 103 compares the frequencies and phases of the data signal and the clock signal. For example, the phase frequency comparison circuit 103 determines a phase difference from a deviation between a falling timing of the clock signal and an edge timing corresponding to the vertical rising or falling of the data signal. Thereafter, the phase frequency comparison circuit 103 outputs a comparison result, that is, a signal which is in proportion to an error between the data signal and the clock signal to the charge pump 105. Specifically, the phase frequency comparison circuit 103 outputs to the charge pump 105 information indicating an adjustment amount of voltage to be input to the VCO 107 according to the error, that is, information on the amount of voltage to be reduced or increased.

FIG. 2B is a block diagram of an optical module (receiving side) according to Embodiment 1. An optical module 10B includes the signal recovery circuit 100, a light receiving circuit 120, a TIA 121, the identification circuit 108, and an output buffer 122.

The light receiving circuit 120 receives the input of the optical signal from another optical module 10. In addition, the light receiving circuit 120 converts the received optical signal into current and inputs the current into the TIA 121. The TIA 121 converts the input current into voltage and outputs the voltage signal to the amplitude detection circuit 102, the phase frequency comparison circuit 103, and the identification circuit 108. Here, since the data signal output from the TIA 121 includes noise or jitter generated by transmission of the signal from another optical module up to the light receiving circuit 120, it is necessary to suppress the noise or jitter.

The signal recovery circuit 100 is a circuit that recovers the clock signal from the data signal. The signal recovery circuit 100 includes the amplitude detection circuit 102, the phase frequency comparison circuit 103, the switch 104, the charge pump 105, the loop filter 106, and the VCO 107.

The VCO 107 is an oscillator whose oscillation frequency varies depending on the input control voltage. The VCO 107 receives the input of the voltage from the loop filter 106. In addition, the VCO 107 oscillates depending on the input voltage to generate the clock signal. The VCO 107 outputs the generated clock signal to the phase frequency comparison circuit 103 and the identification circuit 108. The VCO 107 corresponds to an example of "voltage controlled oscillator."

The phase frequency comparison circuit 103 receives the input of the clock signal from the VCO 107. Further, the phase frequency comparison circuit 103 acquires the data signal output from the transimpedance amplifier (TIA) 121. In addition, the phase frequency comparison circuit 103 compares frequencies and phases of the data signal and the clock signal. For example, the phase frequency comparison circuit 103 determines a phase difference from a deviation between a falling timing of the clock signal and a timing of an edge corresponding to vertical rising or falling of the data signal. Thereafter, the phase frequency comparison circuit 103 outputs a comparison result, that is, a signal which is in proportion to an error between the data signal and the clock signal to the charge pump 105. Specifically, the phase frequency comparison circuit 103 outputs to the charge pump 105 information indicating an adjustment amount of voltage to be input to the VCO 107 according to the error, that is, how much the voltage is to be reduced or to be increased. Further, the optical modules 10 illustrated in FIG. 1 are the optical module 10A illustrated in FIG. 2A and the optical module 10B illustrated in FIG. 2B, respectively.

Figure 3:
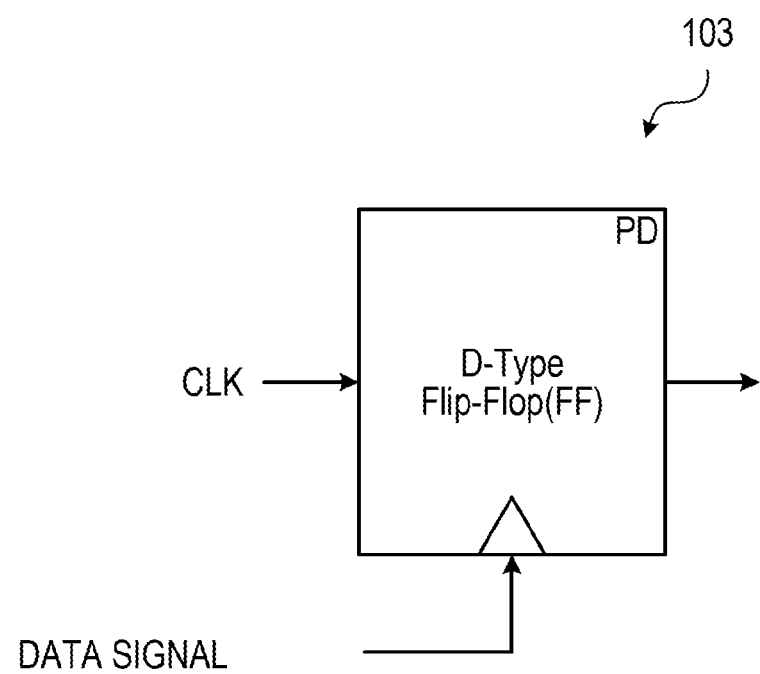
FIG. 3 is a diagram illustrating an example of a phase frequency comparison circuit.

FIG. 3 is a diagram illustrating an example of a phase frequency comparison circuit. In this case, the phase frequency comparison circuit 103 is configured by a D-type flip-flop circuit and samples the clock signal at the timing of the edge corresponding to the vertical rising or falling of the data signal.

Figure 4:
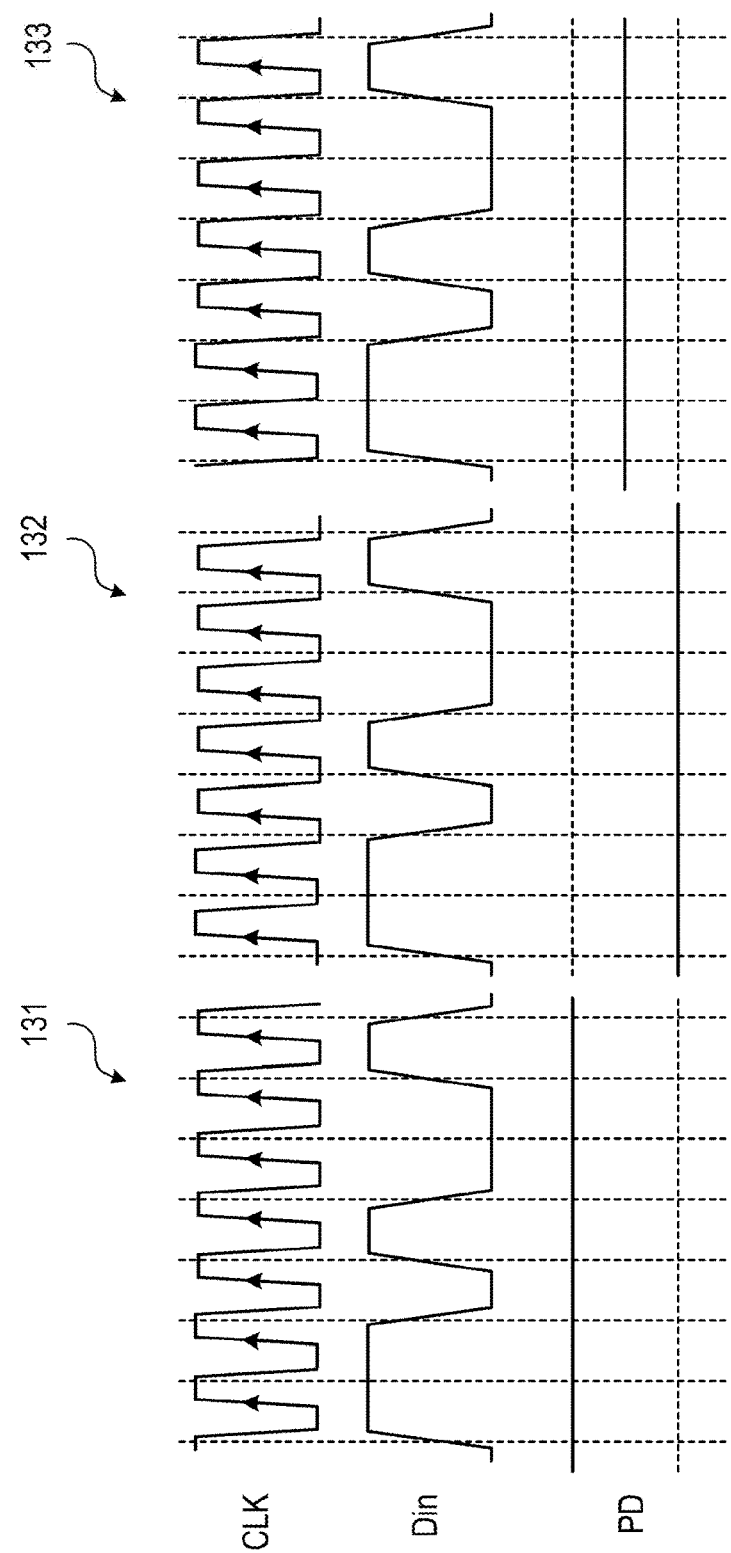
FIG. 4 is a diagram for describing sampling of a signal by the phase frequency comparison circuit.

The phase frequency comparison circuit 103 illustrated in FIG. 3 samples the clock signal as follows. FIG. 4 is a diagram for describing sampling of a signal by the phase frequency comparison circuit. A graph 131 in FIG. 4 represents a state in which the phase of the clock signal is delayed. Further, a graph 132 represents a state in which the phase of the clock signal is advanced. In addition, a graph 133 represents a state in which the phase of the clock signal is optimum.

In a direction toward the graphs 131 and 132, the CLK (clock) at an upper stage represents the clock signal, Din (Data in) at a middle stage represents the data signal input to the input buffer 101, and a phase detector (PD) at a lower stage represents an output signal from the phase frequency comparison circuit 103. The vertical axes of the graphs 131 to 133 represent values of the clock signal, the input data signal, and the output signal value from the phase frequency comparison circuit 103. Further, the horizontal axes of the graphs 131 to 133 represent the elapse of time.

By comparing the graph 131 with the graph 133, it can be seen that the phase of the clock signal lags behind the phase of the data signal. Further, by comparing the graph 132 with the graph 133, it can be seen that the phase of the clock signal leads the phase of the data signal.

In this case, as represented in the graph 131, when the timing of a data edge leads the falling edge of the clock signal, the phase frequency comparison circuit 103 samples "1" of the clock signal. Further, as represented in the graph 132, when the timing of the data edge lags behind the falling edge of the clock signal, the phase frequency comparison circuit 103 samples "0" of the clock signal. As a result, the phase frequency comparison circuit 103 may detect a phase relationship of the clock signal with respect to the data signal. In this case, since the phase frequency comparison circuit 103 is implemented by one D-type flip-flop circuit, it is possible to detect the phase with the simple configuration.

For example, when the phase of the clock signal lags behind the phase of the data signal, the phase frequency comparison circuit 103 outputs a signal representing a high value. That is, the phase frequency comparison circuit 103 outputs a signal having a value of "+1." As a result, the phase frequency comparison circuit 103 advances the phase of the clock signal output from the VCO 107. Meanwhile, when the phase of the clock signal lags leads the phase of the data signal, the phase frequency comparison circuit 103 outputs a signal representing a low value. That is, the phase frequency comparison circuit 103 outputs a signal having a value of "−1." As a result, the phase frequency comparison circuit 103 delays the phase of the clock signal output from the VCO 107.

Since the phase frequency comparison circuit 103 determines the phase difference at the timing of the edge of the data signal, when the same sign is continued in the data signal, the phase difference determination is not performed. Therefore, when the same sign is continued in the data signal, the phase frequency comparison circuit 103 is continued to output the output value at the continuous start of the same sign when the phase frequency comparison circuit 103 of the scheme illustrated in FIG. 3 is used. For example, when the same sign is continued in the data signal after outputting the signal representing the high value, the phase frequency comparison circuit 103 is continued to output the signal representing the high value until the sign of the data signal is changed.

The amplitude detection circuit 102 acquires the data signal output from the input buffer 101. In addition, the amplitude detection circuit 102 detects an amplitude of the input data signal. When a maximum value or a minimum value is detected as the amplitude of the data signal, the amplitude detection circuit 102 outputs to the switch 104 an instruction to connect a path extending from the phase frequency comparison circuit 103 to the charge pump 105. Further, when "1" is detected as the amplitude of the data signal, the amplitude detection circuit 102 outputs to the switch 104 an instruction to connect the path connected to the charge pump 105 to the ground. The amplitude detection circuit 102 and the switch 104 correspond to an example of a "control circuit".

Figure 5:
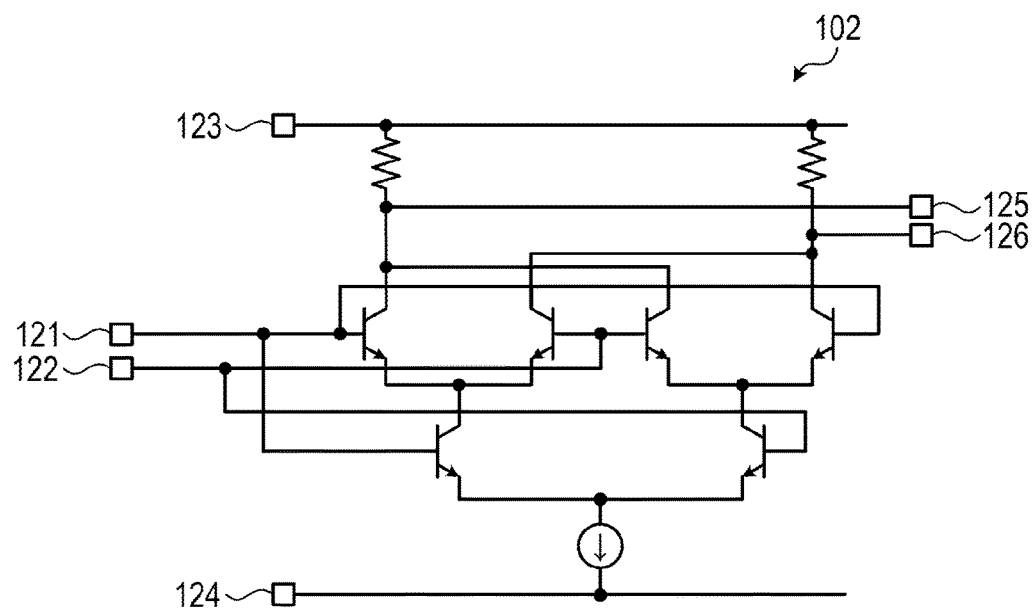
FIG. 5 is a diagram illustrating an example of a circuit for implementing an amplitude detection circuit.

FIG. 5 is a diagram illustrating an example of a circuit for implementing an amplitude detection circuit. The circuit illustrated in FIG. 5 as a differential circuit called a Gilbert multiplication circuit is a circuit which outputs a result of multiplying the signal input to an upper transistor pair and a signal input to a lower transistor pair. When the circuit illustrated in FIG. 5 is used for the amplitude detection circuit 102, the amplitude detection circuit 102 receives the data signals at input terminals 121 and 122. Further, a positive side of power supply voltage is connected to a terminal 123 and a negative side of the power supply voltage is connected to a terminal 124. In addition, operation results are output from output terminals 125 and 126. In this case, since the same signal is input as the signal input to the upper transistor pair and the signal input to the lower transistor pair, the amplitude detection circuit 102 outputs a result obtained from multiplying differential inputs into the input terminals 121 and 122 by the same signal, that is, a square value.

Therefore, when "+1" or "−1" which is a maximum amplitude value is input as the data signal which is a digital signal to the input terminals 121 and 122, the amplitude detection circuit 102 outputs "1" from the output terminals 125 and 126. Further, when "0" which is the maximum amplitude value is input as the data signal which is the digital signal to the input terminals 121 and 122, the amplitude detection circuit 102 outputs "0" from the output terminals 125 and 126.

Figure 6:
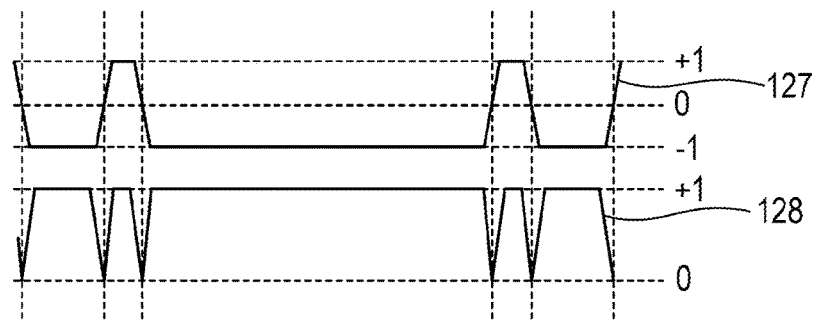
FIG. 6 is a diagram illustrating a relationship between a data signal input to the amplitude detection circuit and an amplitude detection result by the amplitude detection circuit.

FIG. 6 is a diagram illustrating the relationship between a data signal input to the amplitude detection circuit and an amplitude detection result by the amplitude detection circuit. A graph 127 in FIG. 6 represents the amplitude of the data signal, and a graph 128 represents the amplitude detection result by the amplitude detection circuit 102. In FIG. 6, the horizontal axis represents the elapse of time, and the vertical axis represents the size of the amplitude with respect to the graph 127 and represents the output value from the amplitude detection circuit 102 with respect to the graph 128. As illustrated in FIG. 6, the graph 128 becomes "1" at a position corresponding to a part where the amplitude of the graph 127 has a maximum value. In addition, the graph 128 becomes "0" while the amplitude is transited from the maximum value to a minimum value. That is, at a transition point from the maximum value to the minimum value of the amplitude, the amplitude detection circuit 102 outputs "0."

Here, when "1" is assigned to an operation stop of the phase detection and "0" is assigned to an operation execution of the phase detection in respect to the output of the amplitude detection circuit 102, the amplitude detection circuit 102 stops the phase detection while the same sign is continued in the data signal to execute the phase detection at a signal transition point. Therefore, in the optical module 10 according to the embodiment illustrated in FIG. 2, when the output of the amplitude detection circuit 102 is "0," the switch 104 is caused to connect the path extending from the phase frequency comparison circuit 103 to the charge pump 105. When the output of the amplitude detection circuit 102 is "1," the switch 104 is caused to connect the path connected to the charge pump 105, to the ground. Thus, the phase detection operation in the optical module 10 is controlled according to the amplitude detection result of the amplitude detection circuit 102. The amplitude detection circuit 102 corresponds to an example of a "control circuit." In addition, a case where the amplitude detection circuit 102 continuously detects amplitudes other than "0" corresponds to "continuous detection of the same sign." In addition, a case where the amplitude detection circuit 102 detects the amplitude of "0" corresponds to a case where "continuation of the same sign is stopped."

Descriptions will be made referring back to FIG. 2. When the switch 104 receives an input of an instruction to connect the path extending from the phase frequency comparison circuit 103 to the charge pump 105 from the amplitude detection circuit 102, the switch 104 connects the phase frequency comparison circuit 103 and the charge pump 105 to each other. For example, in a case where the amplitude detection circuit 102 has the circuit configuration illustrated in FIG. 5, when the input of the signal having the value of "0" is received, the switch 104 connects the phase frequency comparison circuit 103 and the charge pump 105 to each other.

In addition, when the switch 104 receives an input of an instruction to connect the path connected to the charge pump 105 to the ground from the amplitude detection circuit 102, the switch 104 connects the path connected to the charge pump 105 to the ground. For example, in a case where the amplitude detection circuit 102 has the circuit configuration illustrated in FIG. 3, when the input of the signal having the value of "1" is received, the switch 104 connects the path connected to the charge pump 105 to the ground. Inputting the signal of ground voltage into the charge pump 105 by connecting the input path into the charge pump 105 to the ground by the switch 104 corresponds to an example of supplying a neutral signal which is neither "delayed" nor "advanced" as the phase detection result, that is, "inputting a signal indicating no phase shift."

When the phase frequency comparison circuit 103 and the charge pump 105 are connected to each other by the switch 104, the charge pump 105 receives an input of the adjustment amount of the voltage input to the VCO 107 from the phase frequency comparison circuit 103. In addition, the charge pump 105 causes the loop filter 106 to charge and discharge a charge in accordance with the input adjustment amount.

In this regard, when the input path to the charge pump 105 is connected to the ground by the switch 104, the charge pump 105 receives the input of the neutral signal which is neither "delayed" nor "advanced" as the phase detection result. When the ground voltage is input, the charge pump 105 maintains the charging/discharging of the charge performed by the loop filter 106. That is, the charge pump 105 stops adjusting the control voltage applied to the VCO 107 and maintains the clock signal output from the VCO 107 in a current state. As a result, the adjustment of the phase and frequency of the clock signal generated by the VCO 107 is stopped. The charge pump 105 corresponds to an example of a "voltage adjustment circuit."

The loop filter 106 performs the charging/discharging of the charge, and further, removes noise according to the control from the charge pump 105. Then, the loop filter 106 inputs the control voltage to the VCO 107 according to the charge amount to be maintained.

The identification circuit 108 receives the input of the data signal from the input buffer 101. Further, the identification circuit 108 receives the input of the clock signal generated by the VCO 107. Then, the identification circuit 108 identifies the received data signal. That is, the identification circuit 108 determines the data signal at the timing indicated by the acquired clock signal and determines information included in the data signal.

For example, the identification circuit 108 acquires the value of the data signal, with the falling timing of the clock signal as the vertical rising or falling timing of the data signal. The identification is performed by the identification circuit 108, and as a result, the data signal has accurate data. The identification circuit 108 outputs a data signal for determining the information to the drive circuit 109.

The drive circuit 109 receives the input of the data signal from the identification circuit 108. The drive circuit 109 outputs a control signal for controlling the light emitting circuit 110 based on the acquired data signal. The light emitting circuit 110 outputs the optical signal based on the control signal.

Figure 7:
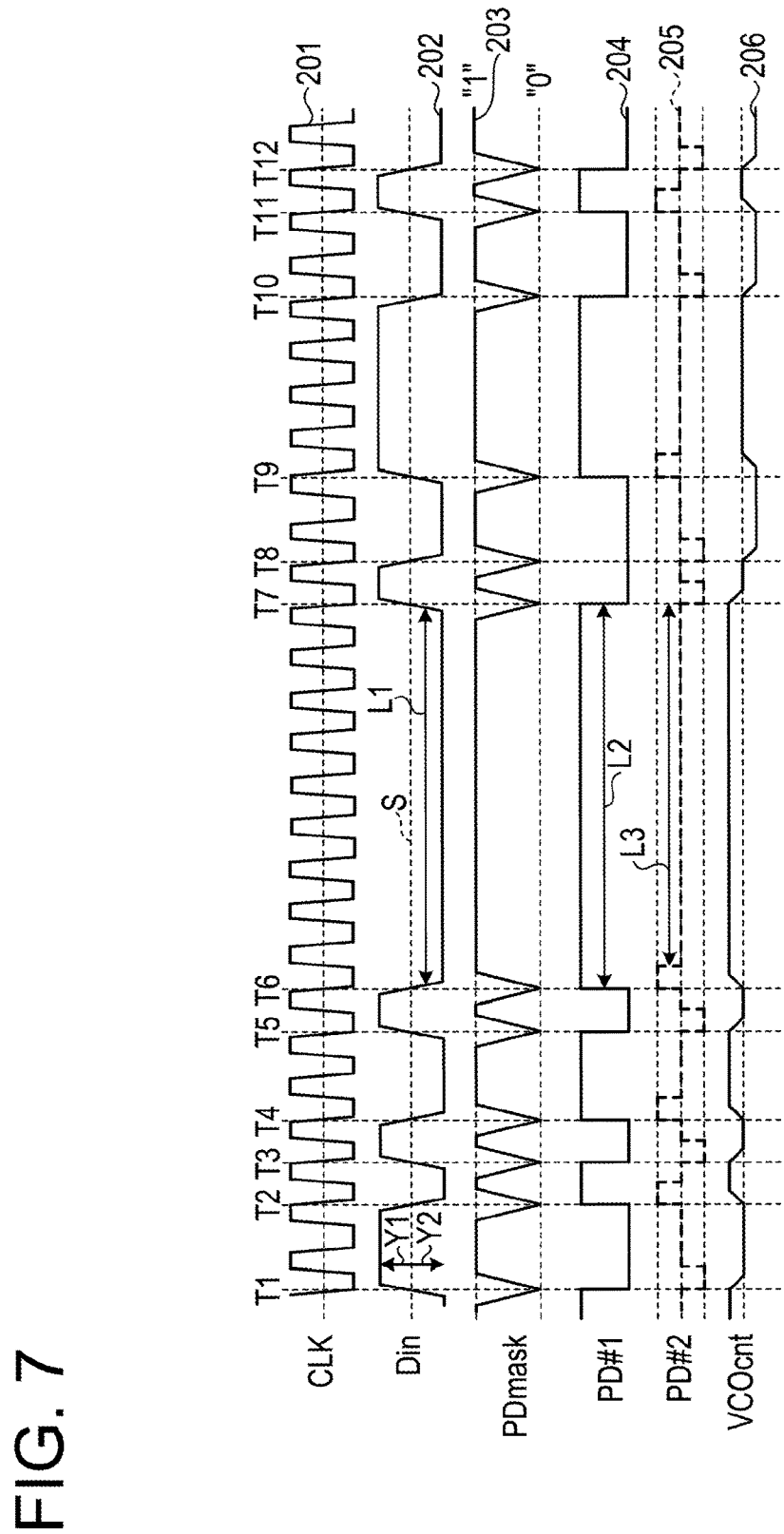
FIG. 7 is a timing chart illustrating a mask operation of a phase comparison result in a clock data recovery circuit according to Embodiment 1.

Next, referring to FIG. 7, the operation of masking the phase comparison result in the signal recovery circuit 100 according to the embodiment will be described. Here, the mask of the phase comparison result indicates stopping the adjustment of the clock signal according to the phase comparison result. FIG. 7 is a timing chart illustrating a mask operation of a phase comparison result in a clock data recovery circuit according to Embodiment 1.

In FIG. 7, The CLK (clock) corresponds to the clock signal, and a graph 201 represents a waveform of the clock signal. Further, Data in (Din) represents the data signal input into the input buffer 101 and a graph 202 represents the waveform of the input data signal. A graph 203 represents a transition of PDmask which is a signal of the amplitude detection result by the amplitude detection circuit 102. A graph 204 represents a transition of PD#1 which is an output signal from the phase frequency comparison circuit 103. A graph 205 represents a transition of PD#2 which is the signal of the phase comparison result input into the charge pump 105. A graph 206 represents a transition of VCOcnt (control) which is the control voltage input into the VCO 107.

The horizontal axis of FIG. 7 represents the elapse of time. Further, the vertical axis in the graph 201 represents the clock signal value. The vertical axis in the graph 202 represents the amplitude of the data signal. The vertical axis in the graph 203 represents the output signal value from the amplitude detection circuit 102. Here, the amplitude detection circuit 102 has the circuit illustrated in FIG. 5. Therefore, an upper-limit value of the vertical axis in the graph 203 represents "+1" toward the page and a lower-limit value represents "0." The vertical axis in the graph 204 represents the output signal value of the phase frequency comparison circuit 103, and the upper limit value represents a High value toward the page and the lower limit value represents a Low value. The vertical axis in a graph 205 represents the input signal value into the charge pump 105, and the upper limit value represents the High value toward the page and the lower limit value represents the Low value. The vertical axis in the graph 206 represents a voltage value of the control voltage.

The VCO 107 outputs the clock signal represented by the graph 201. Further, the data signal represented by the graph 202 is input into the input buffer 101. In this case, the data signal represented by the graph 202 is similarly input into the amplitude detection circuit 102 and the phase frequency comparison circuit 103.

The phase frequency comparison circuit 103 compares the falling of the clock signal and the edge of the data signal. The phase frequency comparison circuit 103 compares timings of the vertical rising of the clock signal and the vertical rising of the data signal at a vertical rising timing T1 of the clock signal. In this case, since the phase of the clock signal leads the phase of the data signal, the phase frequency comparison circuit 103 outputs the signal having the Low value as the phase comparison result as represented in the graph 204. Similarly, since the edge of the data signal exists as represented in the graph 202 at timings T2 to T12, the phase frequency comparison circuit 103 compares the phases at the respective timings T2 to T12 to output the signal of the phase comparison result represented in the graph 204.

Meanwhile, as represented in the graph 202, the data signal has a positive amplitude Y1 and a negative amplitude Y2. Further, the data signal passes through a reference line S when the amplitude is transited from an amplitude Y1 to an amplitude Y2. At an intersection point with the value of the reference line S, the amplitude of the data signal becomes "0." The amplitude detection circuit 102 outputs "1" as the amplitude detection result when the data signal has the amplitude Y1 or Y2. Further, the amplitude detection circuit 102 outputs "0" as the amplitude detection result at the intersection point between the graph 202 and the reference line S. That is, the amplitude detection circuit 102 outputs "0" at the timing when the data signal is transited from the amplitude Y1 to the amplitude Y2 and outputs "1" at other timings. Therefore, the signal of the amplitude detection result becomes 0 at timings T1 to T12 as represented in the graph 203.

In response to the signal of the amplitude detection result becoming "0," the switch 104 connects the path connected to the charge pump 105 to the phase frequency comparison circuit 103. During a period in which the signal of the amplitude detection result is "0," the signal of the phase comparison result is input into the charge pump 105, and thereafter, when the switch 104 switches the path, the signal of the ground voltage is input into the charge pump 105. That is, the input signal into the charge pump 105 is changed as represented in the graph 205. As described above, the signal of the phase comparison result output from the phase frequency comparison circuit 103 represented by the graph 204 is masked, and as a result, the signal represented by the graph 205 is input into the charge pump 105.

When the signal of the phase comparison result output from the phase frequency comparison circuit 103 is input, the charge pump 105 outputs to the loop filter 106 control voltage for changing the frequency of the clock generated by the VCO 107 to be output. In this case, the control voltage applied to the VCO 107 is changed. In this regard, when the signal of the ground voltage is input, the charge pump 105 outputs to the loop filter 106 the control voltage for maintaining the frequency of the clock generated by the VCO 107 to be output. That is, in this case, the adjustment of the control voltage applied to the VCO 107 is stopped. As a result, the control voltage applied to the VCO 107 is changed as represented in the graph 206.

For example, during a period L1 in the graph 202, the same sign is continued in the data signal. During a period L2 in the graph 204, which corresponds to the period L1, the phase frequency comparison circuit 103 outputs a signal of a phase comparison result for changing the phase of the clock signal generated by the VCO 107 in the same direction. However, when the same sign is continued in the data signal, the signal of the phase comparison result is masked, and during a period L3 in the graph 205, the signal of the ground voltage is input into the charge pump 105. As a result, during the period L3, the control voltage is not changed. Therefore, the adjustment of the phase and frequency of the clock signal generated by the VCO 107 is stopped.

Figure 8:
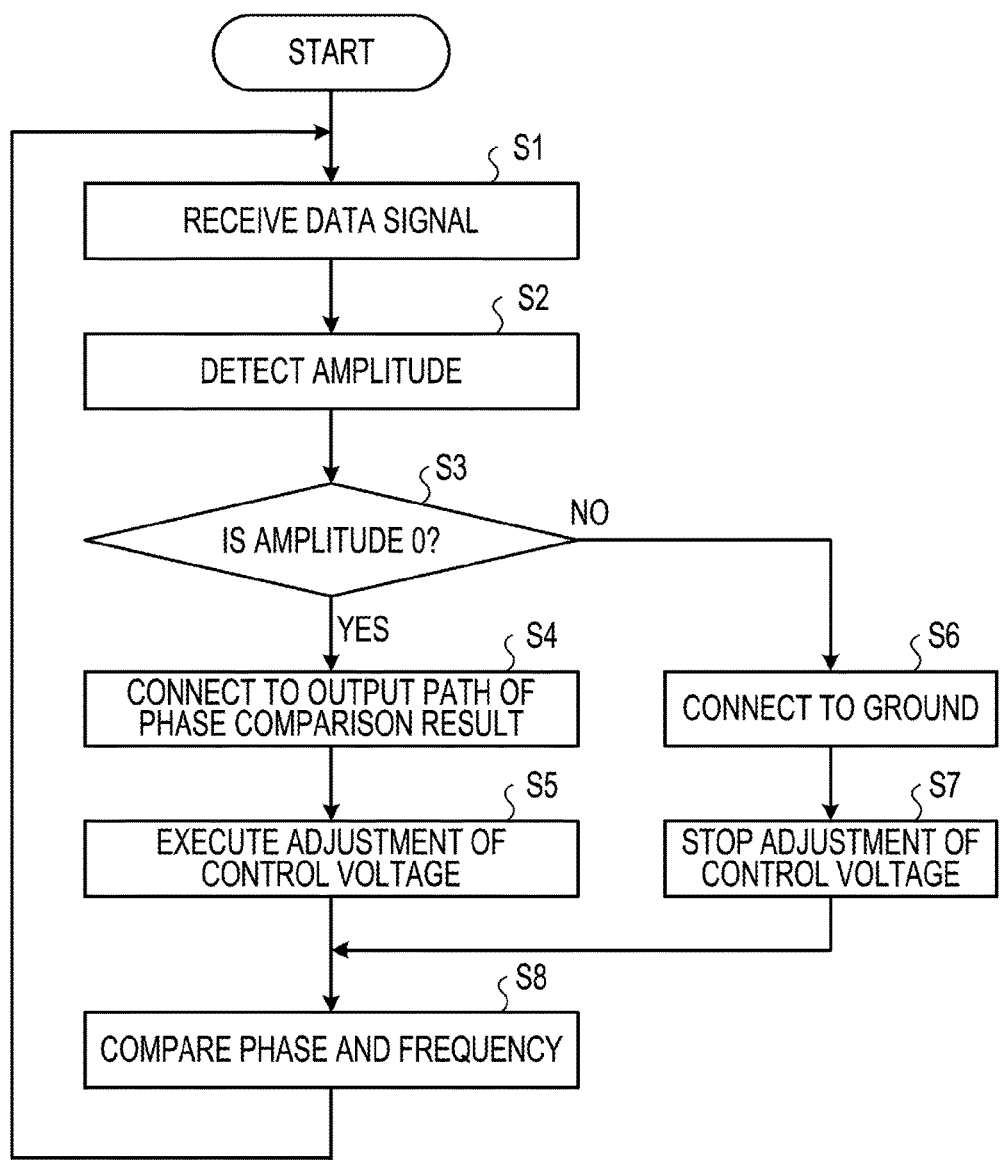
FIG. 8 is a flowchart of adjustment a processing of adjusting a clock signal in the signal recovery circuit according to Embodiment 1.

Next, referring to FIG. 8, a flow of adjustment processing of the clock signal in the signal recovery circuit 100 according to the embodiment will be described. FIG. 8 is a flowchart of adjustment processing of a clock signal in the signal recovery circuit according to Embodiment 1.

The input buffer 101 receives the data signal (step S1). In addition, the input buffer 101 outputs the received data signal to the amplitude detection circuit 102 and the phase frequency comparison circuit 103.

The amplitude detection circuit 102 receives the input of the data signal from the input buffer 101. In addition, the amplitude detection circuit 102 detects the amplitude of the input data signal (step S2).

Next, the amplitude detection circuit 102 determines whether the detected amplitude is "0" (step S3). When it is determined that the amplitude is "0" ("Yes" in step S3), the amplitude detection circuit 102 outputs to the switch 104 an instruction to connect a path extending from the phase frequency comparison circuit 103 to the charge pump 105. In accordance with the instruction input from the amplitude detection circuit 102, the switch 104 connects the path connected to the charge pump 105 to an output path of the phase comparison result (step S4).

Since the charge pump 105 receives the input of the signal of the phase comparison result, the charge pump 105 outputs the signal to the loop filter 106 so as to adjust the control voltage to adjust the control voltage to be applied to the VCO 107 (step S5). In this case, with the change of the control voltage, the phase of the clock signal generated by the VCO 107 is changed.

Meanwhile, when it is determined that the amplitude is not "0" ("No" in step S3), the amplitude detection circuit 102 outputs to the switch 104 an instruction to connect the path connected to the charge pump 105 to the ground. In accordance with the instruction input from the amplitude detection circuit 102, the switch 104 connects the path connected to the charge pump 105 to the ground (step S6).

Since the charge pump 105 receives the input of the signal of the ground voltage, the charge pump 105 outputs the signal to the loop filter 106 so as to maintain the control voltage at that timing to stop adjusting the control voltage to be applied to the VCO 107 (step S7). In this case, the adjustment of the phase of the clock signal generated by the VCO 107 is stopped, and the phase of the clock signal is not changed.

Thereafter, the phase frequency comparison circuit 103 compares the phases and frequencies of the data signal input from the input buffer 101 and the clock signal input from the VCO 107, and outputs the signal of the comparison result (step S8). Further, the identification circuit 108 identifies the data signal by using the clock signal output from the VCO 107. The identified data signal is transmitted to the optical module 10 of the receiving side via the light emitting circuit 110 by the drive circuit 109. Thereafter, the adjustment processing of the control voltage performed by each circuit of the optical module 10 returns to step S1.

Figure 9:
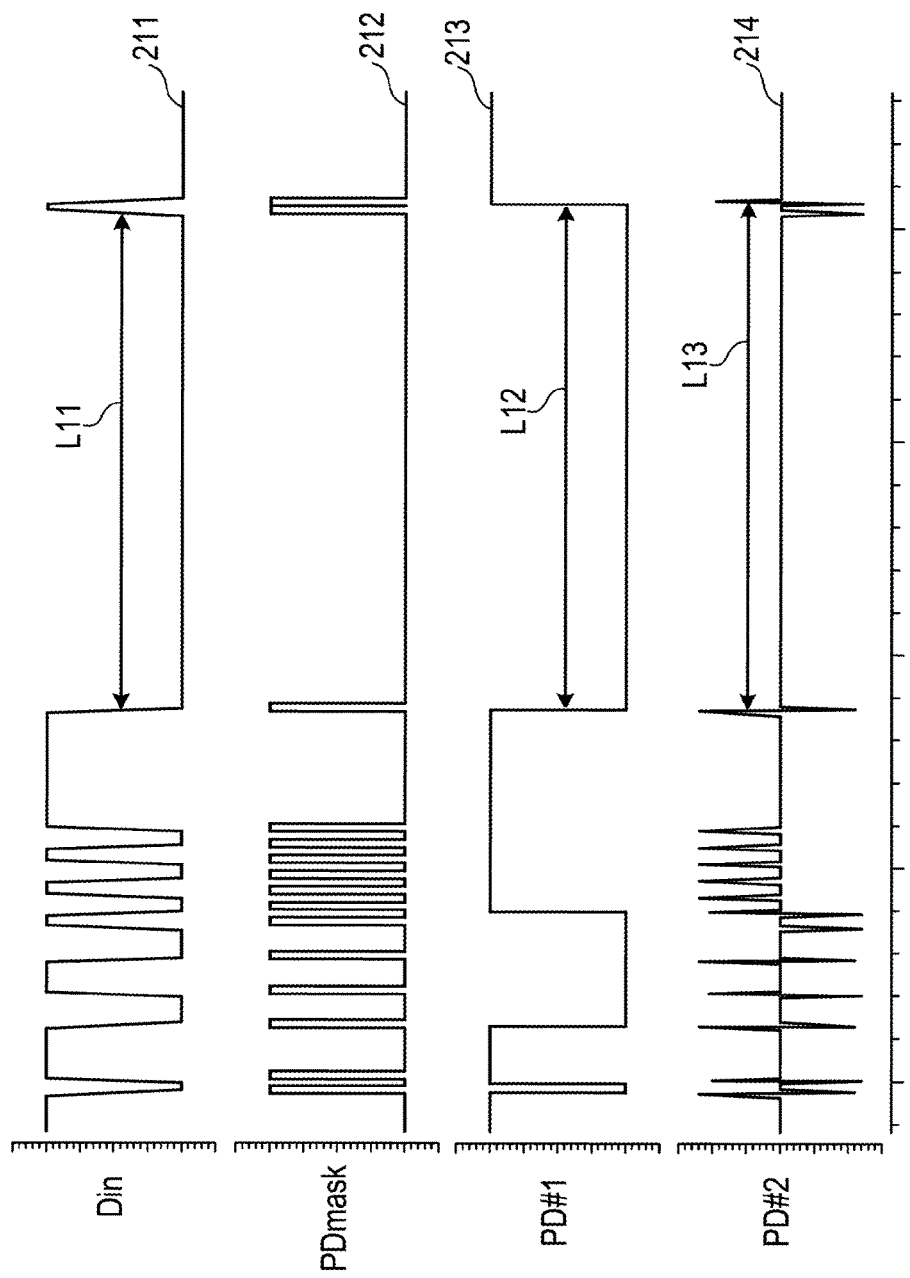
FIG. 9 is a diagram illustrating a simulation result of confirming an operation of the signal recovery circuit according to Embodiment 1.

FIG. 9 is a diagram illustrating a simulation result of confirming an operation of the signal recovery circuit according to Embodiment 1. A graph 211 represents the waveform of the data signal. A graph 212 represents a signal obtained by inverting the amplitude detection result. A graph 213 represents the signal of the phase comparison result. A graph 214 represents the input signal in the charge pump 105.

During a period L11 of the graph 211, the same sign is continued in the data signal. The amplitude detection circuit 102 outputs the signal of the amplitude detection result indicating the maximum value or the minimum value of the amplitude during the period L11. Therefore, as represented in the graph 212, as the signal obtained by inverting the phase comparison result, the signal representing 0 is output during the period L11. Further, the phase frequency comparison circuit 103 outputs the signal of the phase comparison result for shifting the phase of the clock signal in the same direction during a period L12.

An input signal into the charge pump 105 is expressed as a logical product of a signal of the phase comparison result and the signal obtained by inverting the amplitude detection result. Therefore, as represented in the graph 214, the input signal into the charge pump 105 is a signal of the ground voltage which is a neutral signal which is neither "delayed" nor "advanced" as the phase during a period L13. Therefore, during the period L13, the adjustment of the control voltage of the VCO 107 is stopped. That is, the adjustment of the phase and frequency of the clock signal generated by the VCO 107 is stopped.

Figure 10:
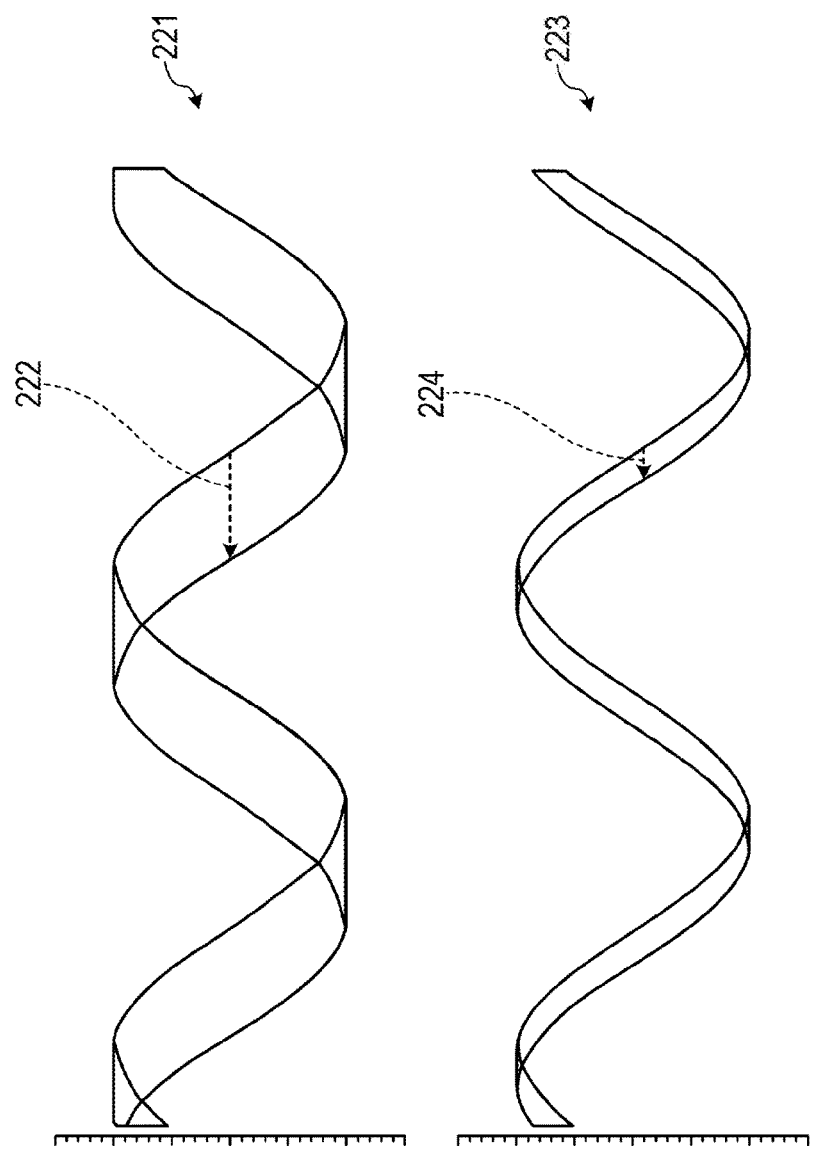
FIG. 10 is a diagram illustrating simulations of clock signals generated in a case of using the signal recovery circuit and in a case of not using the signal recovery circuit according to the embodiment.

FIG. 10 is a diagram illustrating simulations of clock signals generated in the case of using the signal recovery circuit and in a case of not using the clock data recovery circuit according to the embodiment. A graph 221 represents the transition of the clock signal when the optical module 10 according to the embodiment is not used. Further, a graph 223 represents the transition of the clock signal when the optical module 10 according to the embodiment is used.

When the optical module 10 according to the embodiment is not used, the phase of the clock signal varies greatly as represented in the graph 221. For example, at most, the phase of the clock signal is shifted as indicated by a change 222. In this regard, when the optical module 10 according to the embodiment is used, variation of the phase of the clock signal may be suppressed as represented in the graph 223. For example, at most, the phase shift of the clock signal is suppressed to the extent indicated by a change 224. By using the optical module 10 according to the embodiment, it is possible to suppress the change 222 to the change 224, and as a result, by suppressing the phase shift in this manner, the jitter of the clock signal may be reduced.

As described above, in the signal recovery circuit according to the embodiment, when the same sign is continued, the adjustment of the control voltage of the VCO is stopped. Therefore, when the same sign is continued as the data signal for a long time, the phase shift of the clock signal due to fluctuation in control voltage of the VCO for the clock may be suppressed, thereby reducing the jitter. In addition, by identifying the data signal using the clock signal with the reduced jitter, it is possible to accurately identify each data signal, and suppress the occurrence of, for example, sign errors, thereby enhancing a transmission quality of the data signal.

Embodiment 2

Figure 11:
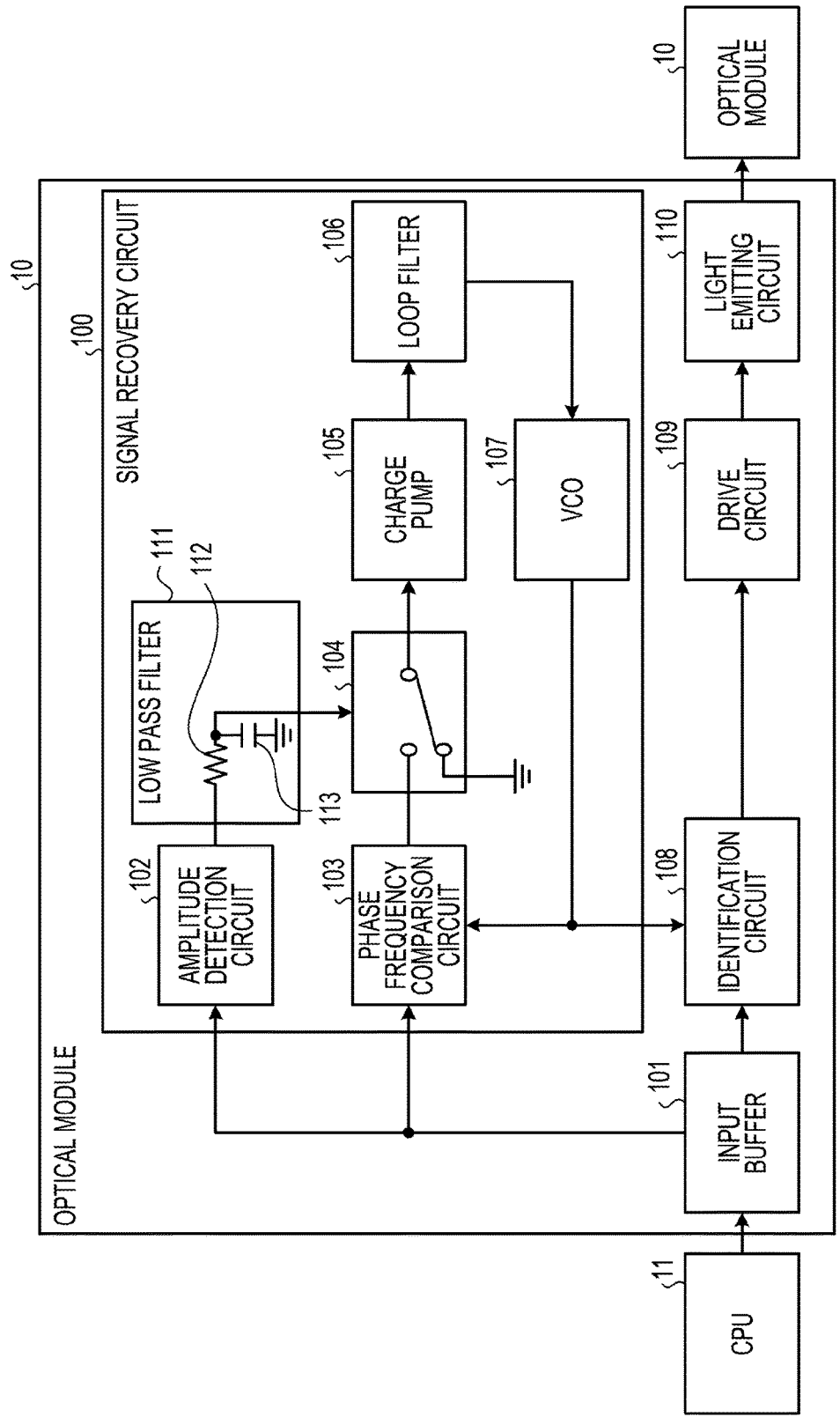
FIG. 11 is a block diagram of an optical module according to Embodiment 2.

FIG. 11 is a block diagram of an optical module according to Embodiment 2. The signal recovery circuit 100 according to the embodiment is different from that according to Embodiment 1 in that vertical rising of the signal of the amplitude detection result output from the amplitude detection circuit 102 is made to be slow to secure a time up to path switching by the switch 104 for a predetermined time. In the following description, the description of the operation of each circuit similar to Embodiment 1 will be omitted.

In the signal recovery circuit 100 according to the embodiment, a low pass filter 111 is disposed on a transmission path of the signal of the amplitude detection result which extends from the amplitude detection circuit 102 to the switch 104.

The low pass filter 111 according to the embodiment includes a resistor 112 disposed on the transmission path of the signal of the amplitude detection result which extends from the amplitude detection circuit 102 to the switch 104. Further, the low pass filter 111 has a path to be connected to the ground through a capacitor 113 between the resistor 112 and the switch 104.

The low pass filter 111 receives the input of the signal of the amplitude detection result from the amplitude detection circuit 102. In addition, the low pass filter 111 extracts a low frequency component of the signal of the amplitude detection result. In addition, the low pass filter 111 outputs the extracted low frequency component of the signal of the amplitude detection result to the switch 104. As a result, the vertical rising of the signal of the amplitude detection result input into the switch 104 may be made to be slow.

The switch 104 receives the input of the signal of the amplitude detection result, of which vertical rising is made to be slow. The switch 104 switches the path extending to the charge pump 105 to be connected to the ground at a time when the input signal of the amplitude detection result exceeds a predetermined threshold value. As a result, when the vertical rising of the input amplitude detection result is made to be slow, a time required for the switch 104 to switch the connection is extended. Further, when the continuation of the same sign is stopped in the data signal until the signal of the amplitude detection result reaches the predetermined threshold value, the switch 104 does not switch the path and the signal of the phase comparison result is continuously input into the charge pump 105.

The vertical rising of the signal of the amplitude detection result is made to be slow, and as a result, even when the same sign of the data signal is continued, the charge pump 105 is continued to receive the input of the signal of the phase comparison result for a predetermined period. In the meantime, the charge pump 105 controls the loop filter 106 to adjust the control voltage, so as to adjust the control voltage applied to the VCO 107. Further, when the continuation of the same sign is stopped in the data signal until the signal of the amplitude detection result reaches the predetermined threshold value, the signal of the ground voltage is not input and the signal of the phase comparison result is continued to be input, and as a result, the charge pump 105 is continued to adjust the control voltage of the VCO 107.

Figure 12:
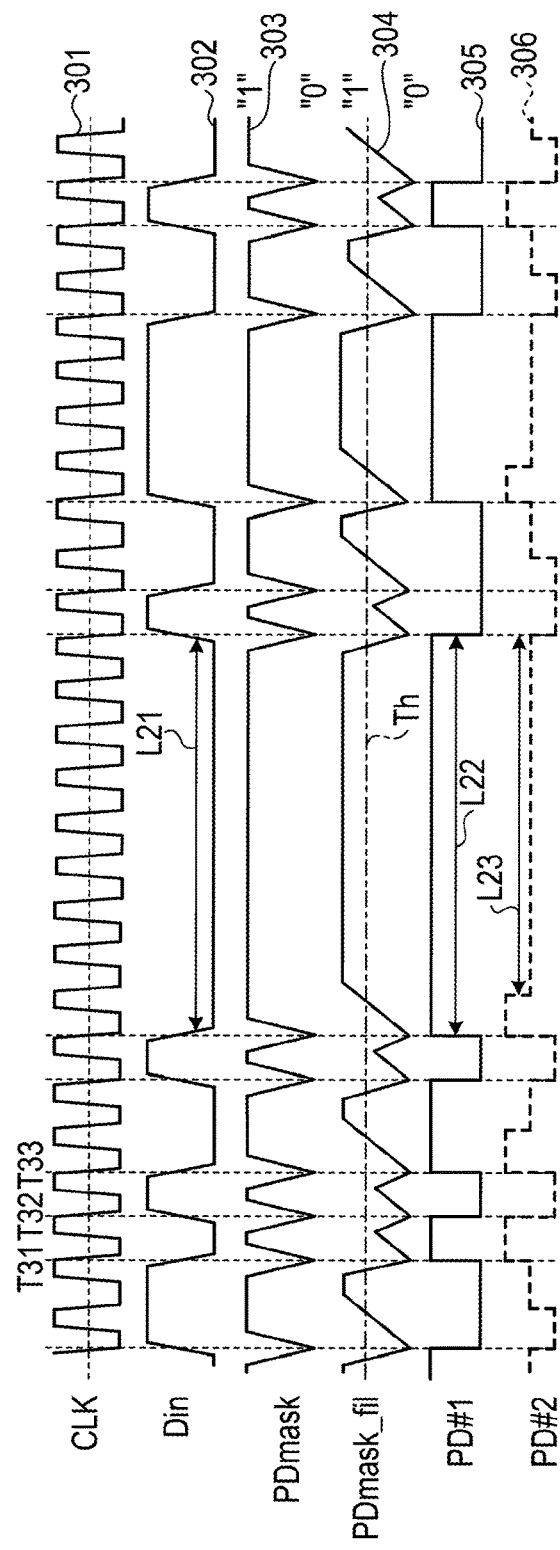
FIG. 12 is a timing chart illustrating a mask operation of a phase comparison result in a signal recovery circuit according to Embodiment 2.

Next, referring to FIG. 12, the operation of masking the phase comparison result in the signal recovery circuit 100 according to the embodiment will be described. FIG. 12 is a timing chart illustrating a mask operation of a phase comparison result in a signal recovery circuit according to Embodiment 2.

In FIG. 12, a graph 301 represents the waveform of the clock signal. A graph 302 represents the waveform of the input data signal. A graph 303 represents a transition of the signal of the amplitude detection result by the amplitude detection circuit 102. A graph 304 represents the transition of PDmask_fil (Filter) which is the signal of the amplitude detection result, of which vertical rising is made to be slow. A graph 305 represents the transition of the output signal from the phase frequency comparison circuit 103. A graph 306 represents the transition of the signal of the phase comparison result input into the charge pump 105.

The horizontal axis of FIG. 12 represents the elapse of time. Further, the vertical axis in the graph 301 represents the clock signal value. The vertical axis in the graph 302 represents the amplitude of the data signal. The vertical axis in the graph 303 represents the output signal value from the amplitude detection circuit 102. The vertical axis in the graph 304 represents the output signal value from the amplitude detection circuit 102, of which vertical rising is made to be slow. The vertical axis in the graph 305 represents the output signal value of the phase frequency comparison circuit 103. The vertical axis in the graph 306 represents the input signal value into the charge pump 105.

In this case as well, during a period L21 in the graph 302, the same sign is continued in the data signal. During a period L22 in the graph 305, which corresponds to the period L21, the phase frequency comparison circuit 103 outputs a signal of a phase comparison result for changing the phase of the clock signal generated by the VCO 107 in the same direction.

Meanwhile, when the same sign is continued in the data signal, the signal of the amplitude detection result for masking the signal of the phase comparison result as represented in the graph 303 is output from the amplitude detection circuit 102. In addition, the vertical rising of the signal of the amplitude detection result is made to be slow by the low pass filter 111 and the signal represented by the graph 304 is input into the switch 104.

Here, descriptions will be made on a case where the switch 104 switches the path connected to the charge pump 105 to be connected to the ground when the input signal value of the amplitude detection result exceeds a threshold Th. In this case, the continuation of the same sign in the data signal occurs between timings T31 and T32 and between timings T32 and T33, but since the value of the signal of the amplitude detection result does not exceed the threshold Th, the switch 104 does not switch the connection. That is, during periods between the corresponding timings, the signal of the phase comparison result is not masked and the adjustment of the control voltage of the VCO 107 is continued. That is, in the meantime, the adjustment of the phase of the clock signal generated by the VCO 107 is continued.

Meanwhile, during the period L21 in the graph 302, since the value of the signal of the amplitude detection result exceeds the threshold Th, the switch 104 switches the connection. However, since the switch 104 starts switching after the value of the signal of the amplitude detection result exceeds the threshold Th, compared to the case of using the signal of the amplitude detection result, of which vertical rising is not made to be slow, the timing at which the ground voltage is input into the charge pump 105 is delayed as in the period L23 of the graph 306. That is, during a difference between the periods L22 and L23, the signal of the phase comparison result is continuously input into the charge pump 105. In the meantime, the charge pump 105 is continued to adjust the control voltage of the VCO 107. That is, in the meantime, the adjustment of the phase of the clock signal generated by the VCO 107 is performed, and then, the phase adjustment of the clock signal is stopped.

As described above, the signal recovery circuit according to the embodiment stops the adjustment of the control voltage of the VCO a predetermined time after the sign of the data signal is transited. As a result, as compared with a case where the data signal continuously stops the adjustment of the control voltage of the VCO immediately, a gain of the phase detection may be increased, thereby suppressing fluctuation of the gain of the phase detection by the change in sign of the data signal. That is, it is possible to reduce the jitter of the clock signal and adjust the phase and frequency of the clock signal appropriately, and suppress the occurrence of, for example, the sign error, thereby enhancing the transmission quality of the data signal.

Embodiment 3

Figure 13:
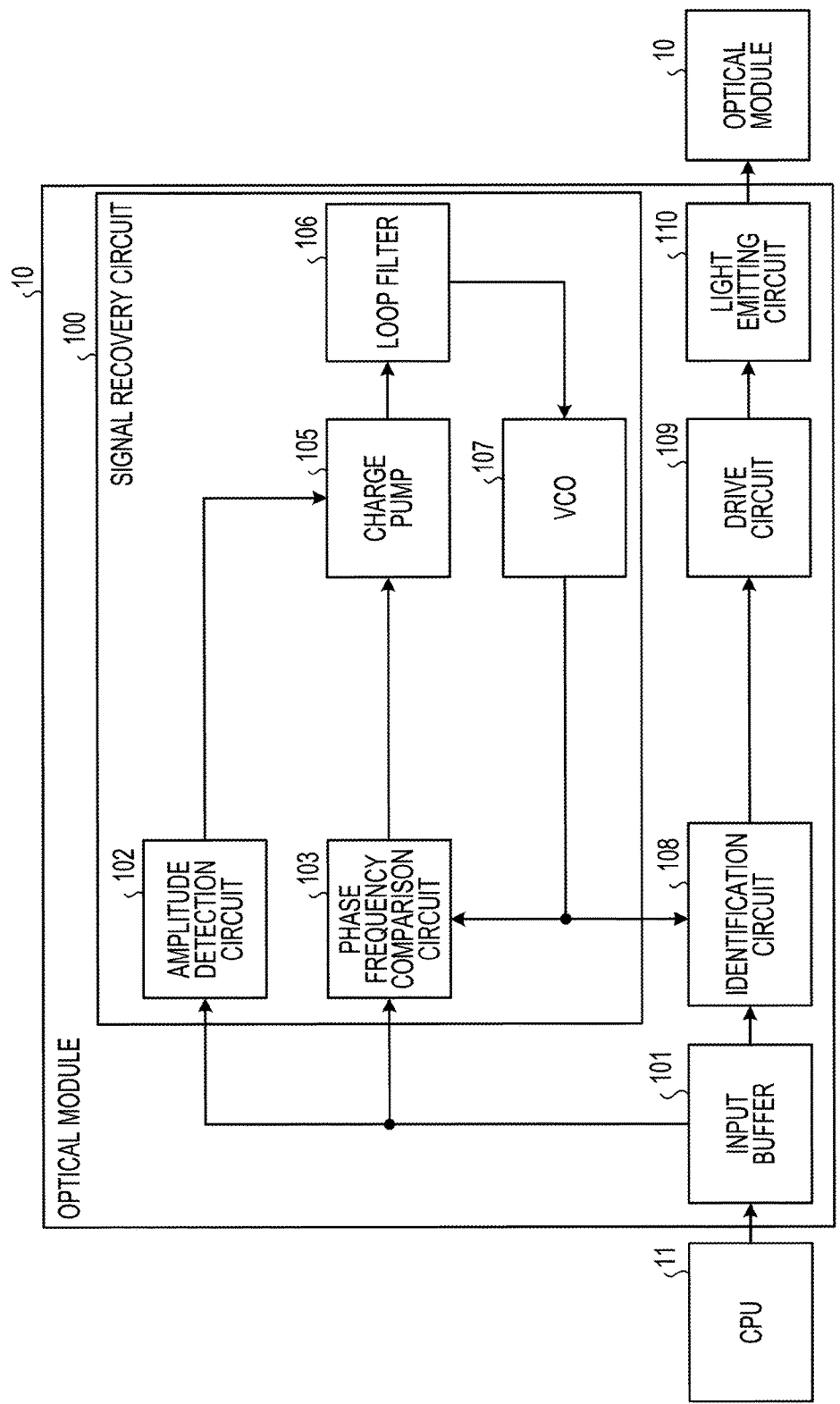
FIG. 13 is a block diagram of an optical module according to Embodiment 3.

FIG. 13 is a block diagram of an optical module according to Embodiment 3. The signal recovery circuit 100 according to the embodiment is different from that of Embodiment 1 in that the adjustment of the phase of the clock signal of the VCO 107 is stopped by controlling output current of the charge pump 105. In the following description, the description of the operation of each circuit similar to Embodiment 1 will be omitted.

The amplitude detection circuit 102 acquires the data signal output from the input buffer 101. In addition, the amplitude detection circuit 102 detects an amplitude of the input data signal. When the maximum value or the minimum value is detected as the amplitude of the data signal, the amplitude detection circuit 102 outputs to the charge pump 105 an instruction to stop the adjustment of the control voltage of the VCO 107. For example, when the maximum value or the minimum value is detected as the amplitude of the data signal, the amplitude detection circuit 102 outputs to the charge pump 105 an instruction to turn off the output of the current.

Further, when "0" is detected as the amplitude of the data signal, the amplitude detection circuit 102 outputs to the charge pump 105 an instruction to execute the adjustment of the control voltage of the VCO 107. For example, when "0" is detected as the amplitude of the data signal, the amplitude detection circuit 102 outputs to the charge pump 105 an instruction to turn on the output of the current.

When the same sign is continued in the data signal, the charge pump 105 receives from the amplitude detection circuit 102 the instruction to stop the adjustment of the control voltage of the VCO 107. In addition, the charge pump 105 turns off the output of the current. As a result, the charge pump 105 stops the adjustment of the control voltage applied to the VCO 107.

When the data signal is not continued, the charge pump 105 receives from the amplitude detection circuit 102 the instruction to execute the adjustment of the control voltage of the VCO 107. In addition, the charge pump 105 outputs the current depending on the signal of the phase comparison result to the loop filter 106. As a result, the charge pump 105 executes the adjustment of the control voltage applied to the VCO 107.

In this case, when the output of the current from the charge pump 105 stops, the VCO 107 maintains the output of the clock signal generated at that time. Meanwhile, when the current is output from the charge pump 105, the VCO 107 generates a clock signal whose phase and frequency are adjusted according to the output current of the charge pump 105. The stop of the output of the current from the charge pump 105 corresponds to an example of "stop of the adjustment of the control voltage."

Next, referring to FIG. 14, an adjustment operation of the control voltage in the signal recovery circuit 100 according to the embodiment will be described. FIG. 12 is a timing chart illustrating an adjustment operation of control voltage in a signal recovery circuit according to Embodiment 3.

Figure 14:
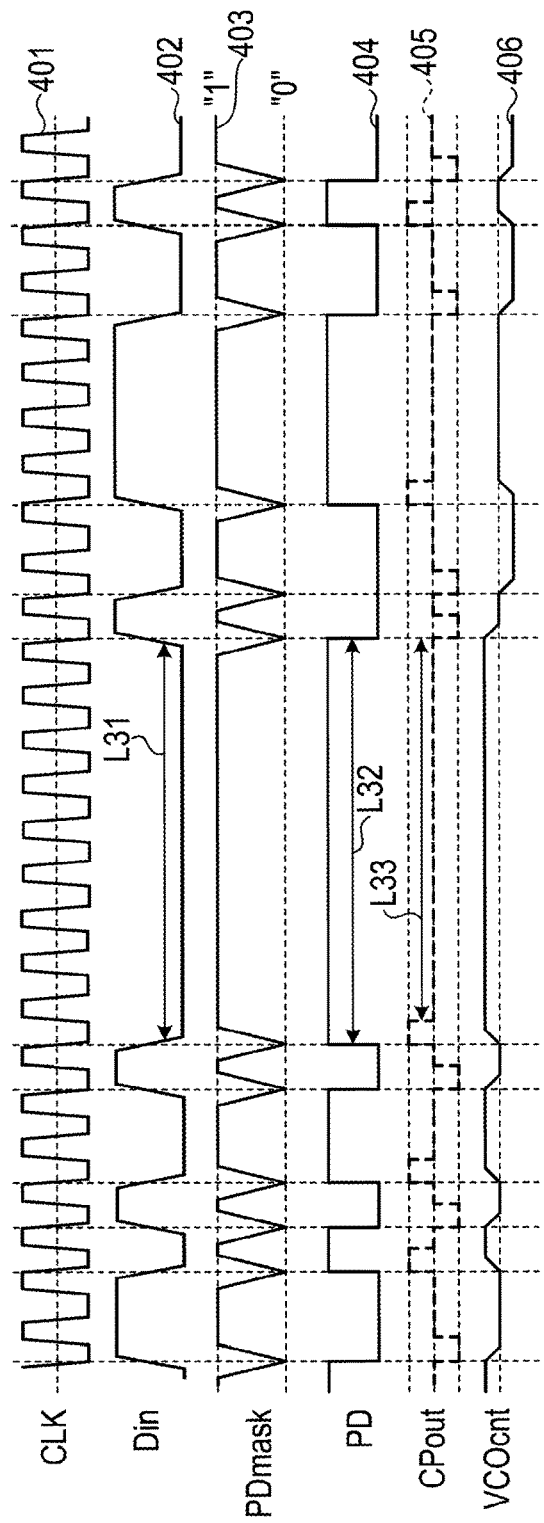
FIG. 14 is a timing chart illustrating an adjustment operation of a control voltage in a signal recovery circuit according to Embodiment 3.

In FIG. 14, a graph 401 represents the waveform of the clock signal. A graph 402 represents the waveform of the input data signal. A graph 403 represents a transition of the signal of the amplitude detection result by the amplitude detection circuit 102. A graph 404 represents the transition of the output signal from the phase frequency comparison circuit 103. A graph 405 represents the transition of CPout which is charge pump (CP) current output from the charge pump 105. A graph 406 represents the transition of the control voltage applied to the VCO 107.

The horizontal axis of FIG. 14 represents the passage of time. Further, the vertical axis in the graph 401 represents the clock signal value. The vertical axis in the graph 402 represents the amplitude of the data signal. The vertical axis in the graph 403 represents the output signal value from the amplitude detection circuit 102. The vertical axis in the graph 404 represents the output signal value of the phase frequency comparison circuit 103. The vertical axis in the graph 405 represents a current value of the CP current. The vertical axis in the graph 406 represents the voltage value of the control voltage applied to the VCO 107.

In this case as well, during a period L31 in the graph 402, the same sign is continued in the data signal. During a period L32 in the graph 404, which corresponds to the period L31, the phase frequency comparison circuit 103 outputs a signal of a phase comparison result for changing the phase of the clock signal generated by the VCO 107 in the same direction.

Meanwhile, when the same sign is continued in the data signal, the signal of the amplitude detection result for controlling the control voltage of the VCO 107 as represented in the graph 403 is output from the amplitude detection circuit 102. The charge pump 105 receives the input of the signal of the amplitude detection result represented by the graph 403. In addition, when the input signal of the amplitude detection result is "1," the charge pump 105 outputs the current. In this regard, when the input signal of the amplitude detection result is "0," the charge pump 105 turns off the output of the current. As a result, the CP current output by the charge pump 105 is represented in the graph 405.

For example, during a period L32 in the graph 404, the phase frequency comparison circuit 103 outputs a signal of a phase comparison result for changing the phase of the clock signal generated by the VCO 107 in the same direction. Meanwhile, the charge pump 105 stops the output of the CP current during a period L33 because the charge pump 105 receives the instruction to turn off the output of the current when the continuation of the same sign occurs in the data signal. As a result, during the period L33, the adjustment of the control voltage applied to the VCO 107 is stopped as represented in the graph 406. That is, in the meantime, the adjustment of the phase of the clock signal generated by the VCO 107 is stopped.

As described above, in the clock data recovery circuit according to the embodiment, when the same sign is continued, the adjustment of the control voltage of the VCO is stopped by turning off the output of the current of the charge pump. As such, in spite of a configuration of controlling the current output by the charge pump, when the same sign is continued as the data signal for a long time, the phase shift of the clock signal due to fluctuation in control voltage of the VCO for the clock may be suppressed, thereby reducing the jitter. In addition, by identifying the data signal using the clock signal with the reduced jitter, it is possible to accurately identify each data signal, and suppress occurrence of, for example, sign errors, thereby enhancing the transmission quality of the data signal.

Embodiment 4

Figure 15:
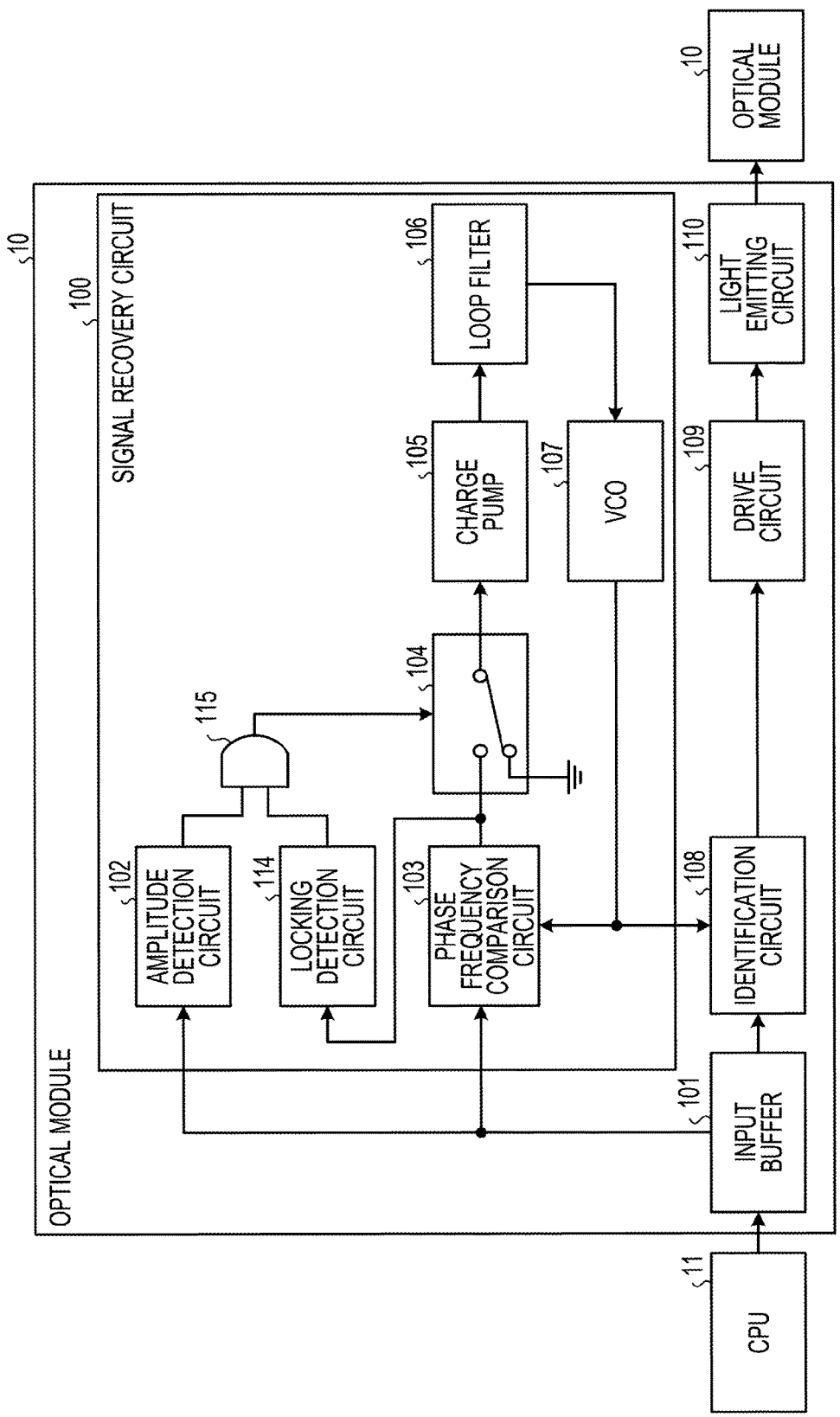
FIG. 15 is a block diagram of an optical module according to Embodiment 4.

FIG. 15 is a block diagram of an optical module according to Embodiment 4. The signal recovery circuit 100 according to the embodiment is different from that of Embodiment 1 in that the phases of a reference signal and a feedback signal synchronized with each other and the adjustment of the phase is stopped after locking occurs. In the following description, the description of the operation of each circuit similar to Embodiment 1 will be omitted.

The signal recovery circuit 100 according to the embodiment further includes a locking detection circuit 114 and an AND circuit 115 in addition to each circuit of Embodiment 1.

The locking detection circuit 114 receives the input of the phase comparison result output from the phase frequency comparison circuit 103. In addition, the locking detection circuit 114 determines whether the phases of the data signal which is the reference signal and the clock signal which is the feedback signal synchronize with each other and a locking state is reached.

The locking detection circuit 114 outputs the signal having the Low value to an AND circuit 115 when the locking state is not detected. Further, the locking detection circuit 114 outputs the signal having the High value to the AND circuit 115 when the locking state is detected.

The amplitude detection circuit 102 outputs the signal having the High value to the AND circuit 115 when the detection result of the amplitude has the maximum value or the minimum value. Further, the amplitude detection circuit 102 outputs the signal having the Low value to the AND circuit 115 when the detection result of the amplitude is "0."

The AND circuit 115 outputs the logical product of the signal input from the amplitude detection circuit 102 and the signal input from the locking detection circuit 114 to the switch 104.

When the switch 104 receives the input of the signal having the High value from the AND circuit 115, the switch 104 connects the path connected to the charge pump 105 to the ground. Further, when the switch 104 receives the input of the signal having the Low value from the AND circuit 115, the switch 104 connects the charge pump 105 and the phase frequency comparison circuit 103 to each other.

As a result, when the continuation of the same sign in the data signal is detected after the locking state is established, the signal of the ground voltage is input into the charge pump 105 and the signal of the phase comparison result is masked. Therefore, after the locking state is established, when the same sign of the data signal is continued, the adjustment of the control voltage of the VCO 107 is stopped and the adjustment of the phase of the clock signal generated by the VCO 107 is stopped.

Figure 16:
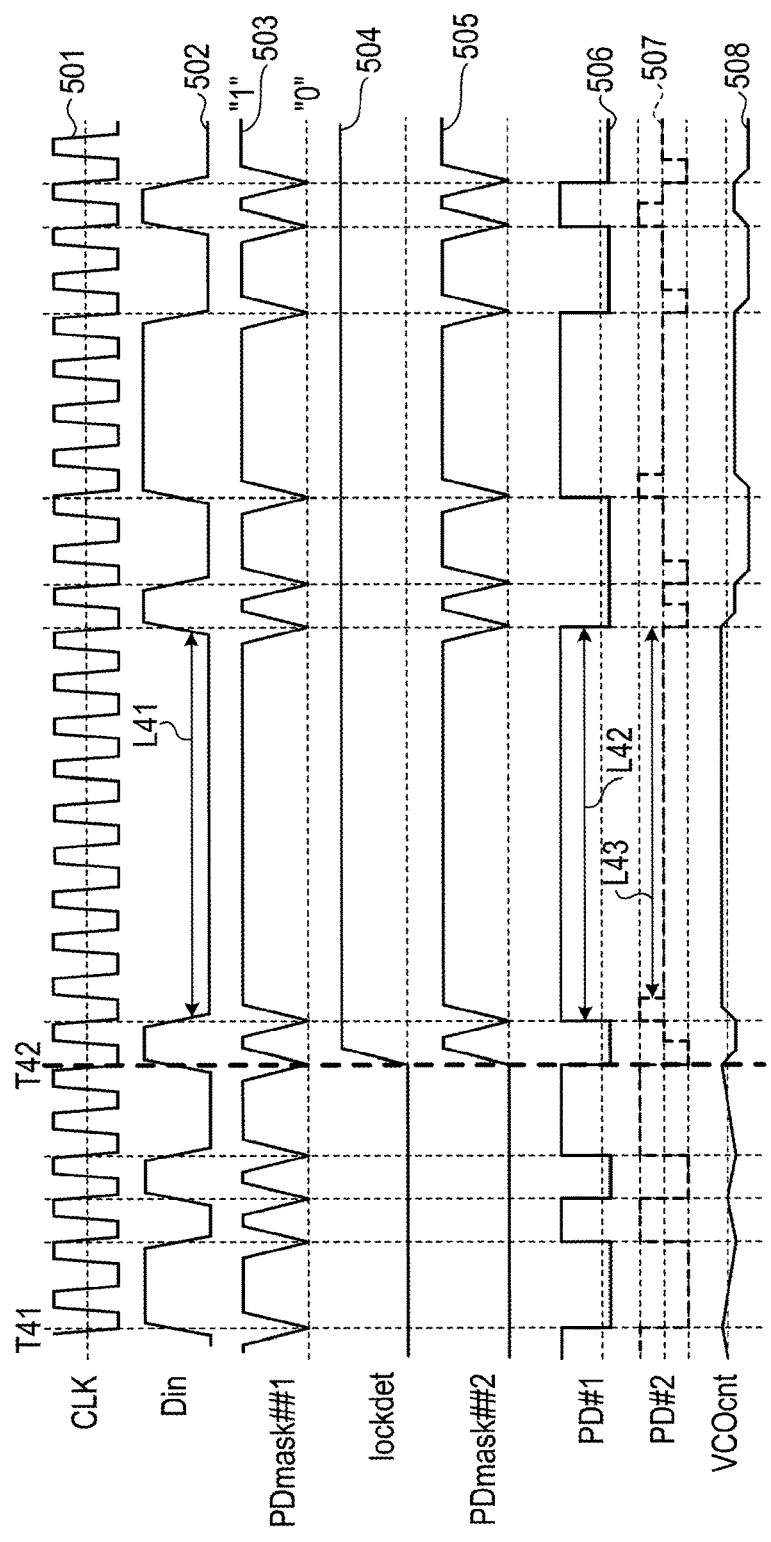
FIG. 16 is a timing chart illustrating a mask operation of a phase comparison result in a signal recovery circuit according to Embodiment 4.

Next, referring to FIG. 16, the adjustment operation of the control voltage in the signal recovery circuit 100 according to the embodiment will be described. FIG. 16 is a timing chart illustrating a mask operation of a phase comparison result in a signal recovery circuit according to Embodiment 4.

In FIG. 16, a graph 501 represents the waveform of the clock signal. A graph 502 represents the waveform of the input data signal. A graph 503 represents the transition of PDmask##1 which is the signal of the amplitude detection result by the amplitude detection circuit 102. A graph 504 represents the transition of lockdet (lock Determine) which is the signal of a locking determination result by the locking detection circuit 114. A graph 505 represents the transition of PDmask##2 which is the signal output from the AND circuit 115. A graph 506 represents the transition of the output signal from the phase frequency comparison circuit 103. A graph 507 represents the transition of the signal input into the charge pump 105. A graph 508 represents the transition of the control voltage applied to the VCO 107.

The horizontal axis of FIG. 16 represents the passage of time. Further, the vertical axis in the graph 501 represents the clock signal value. The vertical axis in the graph 502 represents the amplitude of the data signal. The vertical axis in the graph 503 represents the output signal value from the amplitude detection circuit 102. The vertical axis in the graph 504 represents a signal value of a locking determination result. The vertical axis in the graph 505 represents the signal value output from the AND circuit 115. The vertical axis in the graph 506 represents the output signal value of the phase frequency comparison circuit 103. The vertical axis in the graph 507 represents the signal value input into the charge pump 105. The vertical axis in the graph 508 represents the voltage value of the control voltage applied to the VCO 107.

In this case as well, during a period L41 in the graph 502, the same sign is continued in the data signal. During a period L42 in the graph 506, which corresponds to the period L41, the phase frequency comparison circuit 103 outputs a signal of a phase comparison result for changing the phase of the clock signal generated by the VCO 107 in the same direction.

Meanwhile, when the same sign is continued in the data signal, the signal of the amplitude detection result for controlling the control voltage of the VCO 107 as represented in the graph 503 is output from the amplitude detection circuit 102. Further, the locking detection circuit 114 determines the locking state at a timing T42. Therefore, the locking detection circuit 114 outputs the signal having the Low value up to timings T41 and T42 and outputs the signal having the High value after the timing T42.

Therefore, during a period between the timing T41 and the timing T42, the AND circuit 115 is continued to output the signal of the Low value regardless of the value of the signal of the amplitude detection result. In addition, after the timing T42, the AND circuit 115 outputs the signal value of the amplitude detection result.

Accordingly, during the period between the timings T41 and T42, the signal of the phase comparison result is not masked and the charge pump 105 is continued to adjust the control voltage applied to the VCO 107. That is, the phase of the clock signal generated by the VCO 107 is not adjusted.

Meanwhile, after the timing T42, the charge pump 105 receives the input of the signal represented by the graph 504. As a result, for example, during a period L43, the charge pump 105 stops the adjustment of the control voltage applied to the VCO 107. As a result, during the period L43, the adjustment of the control voltage applied to the VCO 107 is stopped as represented in the graph 508. That is, in the meantime, the adjustment of the phase of the clock signal generated by the VCO 107 is stopped.

As described above, in the signal recovery circuit according to the embodiment, after the locking state is established, when the same sign is continued, the adjustment of the control voltage of the VCO is stopped. Before the locking state is established, adjusting the phase and frequency of the clock signal without masking the phase detection result signal may shorten the time until the lock state is established. Meanwhile, after the locking state is established, the signal of the phase detection result is masked to reduce the jitter of the clock signal. Therefore, it is possible to implement rapid synchronization of the phase and the identification of the data signal using the clock signal with the reduced jitter, thereby enhancing the transmission quality of the data signal. Further, in the embodiment, whether the locking state is established is determined based on the phase comparison result, but other detection methods may be used in the case of the result of detecting that the locking state is established. For example, even though, for example, a method for detecting the locking state from the result of the output of the identification circuit is used, the same effect may be achieved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A signal recovery circuit comprising:
a voltage controlled oscillator configured to generate a clock signal;
a phase frequency comparison circuit configured to:
compare phases of the clock signal and a received input signal, and
compare frequencies of the clock signal and the received input signal;
a voltage adjustment circuit configured to adjust the phase of the clock signal by adjusting control voltage of the voltage controlled oscillator based on an output of the phase frequency comparison circuit; and
a control circuit configured to:
acquire an amplitude of the received input signal,
detect continuation of the same sign in the received input signal based on the acquired amplitude,
stop an adjustment of the phase of the clock signal generated by the voltage controlled oscillator when the continuation of the same sign is detected, and
execute adjustment of the phase of the clock signal generated by the voltage controlled oscillator when the continuation of the same sign is stopped.

2. The signal recovery circuit according to claim 1, wherein when the amplitude of the received input signal is 0, the control circuit detects the stop of the continuation of the same sign.

3. The signal recovery circuit according to claim 1, wherein the control circuit stops the adjustment of the phase of the clock signal generated by the voltage controlled oscillator when a predetermined period has elapsed after detecting the continuation of the same sign.

4. The signal recovery circuit according to claim 1, wherein the control circuit stops the adjustment of the phase of the clock signal generated by the voltage controlled oscillator by inputting a signal indicating that there is no phase shift to the voltage adjustment circuit.

5. The signal recovery circuit according to claim 1, wherein the control circuit stops the adjustment of the phase of the clock signal generated by the voltage controlled oscillator by stopping an adjustment of the control voltage by the voltage adjustment circuit.

6. The signal recovery circuit according to claim 1, further comprising:
a locking detection circuit configured to detect a phase locking which is a state where the phases of the clock signal generated by the voltage controlled oscillator and the input signal synchronize with each other,
wherein when the phase locking is detected by the locking detection circuit, the control circuit stops the adjustment of the phase of the clock signal generated by the voltage controlled oscillator at the time of detecting the continuation of the same sign.

7. An information processing system comprising:
a transmitting side optical module; and
a receiving side optical module connected to the transmitting side optical module,
each of the transmitting side optical module and the receiving side optical module includes a signal recovery circuit comprising:
a voltage controlled oscillator configured to generate a clock signal;
a phase frequency comparison circuit configured to:
compare phases of the clock signal and a received input signal, and
compare frequencies of the clock signal and the received input signal;
a voltage adjustment circuit configured to adjust the phase of the clock signal by adjusting control voltage of the voltage controlled oscillator based on an output of the phase frequency comparison circuit;
a control circuit configured to:
acquire an amplitude of the input signal,
detect continuation of the same sign in the input signal based on the acquired amplitude,
stop an adjustment of the phase of the clock signal generated by the voltage controlled oscillator when the continuation of the same sign is detected, and
execute adjustment of the phase of the clock signal generated by the voltage controlled oscillator when the continuation of the same sign is stopped,
the transmitting side optical module comprises:
an identification circuit configured to:
generate an identification signal by identifying the input signal based on the clock signal generated by the voltage controlled oscillator, and
output the generated identification signal;
a drive circuit configured to output a control signal based on the identification signal output from the identification circuit; and
a light emitting circuit configured to output an optical signal based on the control signal output from the drive circuit, and
the receiving side optical module comprises:
a light receiving circuit configured to:

convert the optical signal output from the light emitting circuit of the transmitting side optical module into current, and output the converted current; and a transimpedance amplifier configured to:
convert the current output from the light receiving circuit into voltage, and
output the converted voltage to each of the phase frequency comparison circuit, the control circuit, and the identification circuit of the receiving side optical module.

8. A signal recovery method for a signal recovery circuit including a voltage controlled oscillator configured to generate a clock signal, a phase frequency comparison circuit, a voltage adjustment circuit, and a control circuit, the method comprising:
comparing, by the phase frequency comparison circuit, phases of the clock signal and a received input signal;
comparing, by the phase frequency comparison circuit, frequencies of the clock signal and the received input signal;
adjusting, by the voltage adjustment circuit, the phase of the clock signal by adjusting control voltage of the voltage controlled oscillator based on an output of the phase frequency comparison circuit;
acquiring, by the control circuit, an amplitude of the input signal;
detecting, by the control circuit, continuation of the same sign in the input signal based on the acquired amplitude;
stopping, by the control circuit, an adjustment of the phase of the clock signal generated by the voltage controlled oscillator when the continuation of the same sign is detected; and
executing, by the control circuit, adjustment of the phase of the clock signal generated by the voltage controlled oscillator when the continuation of the same sign is stopped.

9. The method according to claim 8, wherein when the amplitude of the received input signal is 0, the control circuit detects the stop of the continuation of the same sign.

10. The method according to claim 8, wherein the control circuit stops the adjustment of the phase of the clock signal generated by the voltage controlled oscillator when a predetermined period has elapsed after detecting the continuation of the same sign.

11. The method according to claim 8, wherein the control circuit stops the adjustment of the phase of the clock signal generated by the voltage controlled oscillator by inputting a signal indicating that there is no phase shift to the voltage adjustment circuit.

12. The method according to claim 8, wherein the control circuit stops the adjustment of the phase of the clock signal generated by the voltage controlled oscillator by stopping an adjustment of the control voltage by the voltage adjustment circuit.

* * * * *